(12) United States Patent
Palsule et al.

(10) Patent No.: US 7,557,397 B2
(45) Date of Patent: Jul. 7, 2009

(54) PIXEL WITH ASYMMETRIC TRANSFER GATE CHANNEL DOPING

(75) Inventors: Chintamani P. Palsule, Fort Collins, CO (US); Changhoon Choi, Palo Alto, CA (US); Fredrick P. LaMaster, Fort Collins, CO (US); John H. Stanback, Fort Collins, CO (US); Thomas E. Dungan, Fort Collins, CO (US); Thomas Joy, San Jose, CA (US); Homayoon Haddad, Beaverton, OR (US)

(73) Assignee: Aptina Imaging Corporation, Grand Cayman (KY)

( * ) Notice: Subject to any disclaimer, the term of this patent is extended or adjusted under 35 U.S.C. 154(b) by 193 days.

(21) Appl. No.: 11/707,848

(22) Filed: Feb. 16, 2007

(65) Prior Publication Data

US 2007/0262355 A1 Nov. 15, 2007

Related U.S. Application Data

(63) Continuation-in-part of application No. 11/144,304, filed on Jun. 3, 2005, now Pat. No. 7,115,924, and a continuation of application No. 11/323,693, filed on Dec. 30, 2005.

(51) Int. Cl.
*H01L 31/06* (2006.01)
*H01L 21/00* (2006.01)

(52) U.S. Cl. .................. 257/292; 257/233; 257/291; 257/404; 257/431; 257/655; 438/286

(58) Field of Classification Search .................. 257/233, 257/431, 291, 292, 83, 84, 101, 444, 462, 257/463, 404, 655; 438/286
See application file for complete search history.

(56) References Cited

U.S. PATENT DOCUMENTS 5,625,210 A * 4/1997 Lee et al. ..................... 257/292

(Continued)

OTHER PUBLICATIONS

Kuo, James B., et al., "MOS Pass Transistor Turn-Off Transient Analysis," IEEE Transactions on Electron Devices, vol. ED-35, No. 10, Oct. 1986, pp. 1545-1555.*

(Continued)

*Primary Examiner*—N Drew Richards
*Assistant Examiner*—Jeremy J Joy
(74) *Attorney, Agent, or Firm*—Ratner Prestia

(57) ABSTRACT

A pixel including a substrate of a first conductivity type and having a surface, a photodetector of a second conductivity type that is opposite the first conductivity type, a floating diffusion region of the second conductivity type, a transfer region between the photodetector and the floating diffusion, a gate positioned above the transfer region and partially overlapping the photodetector, and a pinning layer of the first conductivity type extending at least across the photodetector from the gate. A channel implant of the first conductivity type extending from between a midpoint of the transfer gate and the floating diffusion to at least across the photodiode and having a dopant concentration such that a dopant concentration of the transfer region is greater proximate to the photodetector than the floating diffusion, and wherein a peak dopant concentration of the channel implant is at a level and at a depth below the surface such that a partially-buried channel is formed in the transfer region between the photodiode and floating diffusion when the transfer gate is energized.

14 Claims, 14 Drawing Sheets

U.S. PATENT DOCUMENTS

| | | | | |
|---|---|---|---|---|
| 5,880,495 | A * | 3/1999 | Chen | 257/233 |
| 6,100,551 | A * | 8/2000 | Lee et al. | 257/232 |
| 6,127,697 | A * | 10/2000 | Guidash | 257/292 |
| 6,184,055 | B1 * | 2/2001 | Yang et al. | 438/57 |
| 6,504,193 | B1 * | 1/2003 | Ishiwata et al. | 257/291 |
| 6,730,899 | B1 * | 5/2004 | Stevens et al. | 250/208.1 |
| 7,148,528 | B2 * | 12/2006 | Rhodes | 257/292 |
| 7,368,339 | B2 * | 5/2008 | Rhodes | 438/197 |
| 2005/0001248 | A1 * | 1/2005 | Rhodes | 257/292 |
| 2005/0006676 | A1 * | 1/2005 | Watanabe | 257/290 |
| 2005/0280054 | A1 * | 12/2005 | Park et al. | 257/290 |
| 2006/0022232 | A1 * | 2/2006 | Lim | 257/291 |
| 2006/0084195 | A1 * | 4/2006 | Lyu | 438/48 |
| 2006/0255382 | A1 * | 11/2006 | Rhodes | 257/292 |
| 2007/0158771 | A1 * | 7/2007 | Hynecek | 257/431 |

OTHER PUBLICATIONS

Inoue, Ikuko et al., "Low-Leakage-Current and Low-Operating-Voltage Buried Photodiode for a CMOS Imager," IEEE Transacations on Electron Devices, vol. 50, No. 1, Jan. 2003, pp. 43-47.*

Mabuchi, Keiji et ah, "CMOS Image Sensors Comprised of Floating Diffusion Driving Pixels with Buried ☐☐Photodiode," IEEE Journal of Solid-State Circuits, vol. 39, No. 12, Dec. 2004, p. 2408-2416.*

Tekahaski, Hidekazu et al., "A 3.9-μm Pixel Pitch VGA Format 10-b Digital Output CMOS Image Sensor ☐☐with 1.5 Transistor/Pixel," IEEE Journal of Solid-State Circuits, vol. 39, No. 12, Dec. 2004, pp. 2417-2425.*

Mitsuyoshi, Mori et al., "1/4-Inch 2-Mpixel MOS Image Sensor with 1.75 Transistors/Pixel," IEEE Journal of Solid-State Circuits, vol. 39, No. 12, Dec. 2004.*

* cited by examiner

PIXEL WITH ASYMMETRIC TRANSFER GATE CHANNEL DOPING

CROSS-REFERENCE TO RELATED APPLICATIONS

This is a Continuation of copending application Ser. No. 11/323,693, filed on Dec. 30, 2005 the entire disclosure of which is incorporated herein by reference.

This application is a continuation-in-part of Ser. No. 11/144,304 filed Jun. 3, 2005 now U.S. Pat. No. 7,115,924, which is incorporated by reference herein in its entirety.

BACKGROUND

Digital cameras employing complementary metal-oxide semiconductors (CMOS) image sensors having 4-transistor pixel structures with buried, gated diodes generally provide better image quality than their counterparts employing 3-transistor CMOS image sensors because the buried photodiode configuration reduces the amount of surface generated current which reduces dark current, and because the transfer gate used to access the photodiode enables the use of correlated double sampling which reduces noise. However, as described below, dark current can be generated in regions of the pixel in addition to the photodiode.

A 4-transistor pixel typically includes a photodiode, a charge-to-voltage conversion region ("floating diffusion"), and a charge transfer region. The photodiode and floating diffusion are built in a substrate (e.g. silicon) with the charge transfer region typically being a MOSFET ("transfer gate") positioned between the diode and floating diffusion.

The pixel has two modes of operation, a charge collection or integration mode and a charge transfer or readout mode. Prior to integration, the floating diffusion is set to a "high" voltage and the transfer gate is turned on so as to extract all electrons from the photodiode so that is becomes "fully depleted." During integration, the transfer gate is held at a low voltage (e.g. ground) and the diode is exposed to light and collects photo-generated electrons. At the conclusion of the integration period, during the readout mode, the floating diffusion is again set to a "high" voltage and the transfer gate is turned on so that electrons are transferred from the photodiode to the floating diffusion via the charge transfer region.

The charge transfer region is essentially the channel region of a "normally off" or enhancement-mode type NMOSFET. During integration, the transfer gate is "turned off." However, even though the transfer gate is turned off, current can be generated in surface of the channel region, particularly in the region closest to the photodiode. This current contributes to dark current and is generated by sources other than incident light (e.g. heat). Because of its proximity to the photodiode, this dark current may leak into the photodiode during integration, thereby resulting in "noise" and limiting the pixel's imaging performance.

To reduce dark current generated in this region, one type of pixel structure employs a charge transfer region having a surface region extending essentially along an entire length and width of the transfer gate that is implanted with a dopant that enhances the conductivity of the charge transfer region relative to the substrate. By enhancing the conductivity in this fashion, the surface region of the charge transfer region is accumulated with "holes" when the transfer gate is held at the low-voltage level so as to quench dark current generation in this area.

Image quality can also be adversely affected by incomplete charge transfer from the photodiode to the floating diffusion and by subsurface leakage current. During the charge transfer cycle, the transfer gate voltage is set "high." As charge is transferred from the photodiode to the floating diffusion, the potential of the floating diffusion begins to fall while the potential of the photodiode begins to rise. If the floating diffusion potential drops to the level of the transfer gate channel surface potential, some of the charge being transferred from the photodiode may remain in the transfer gate channel region until the end of the charge transfer cycle when the transfer gate voltage is dropped toward ground. At this point, some these charges (i.e. electrons) may return to the photodiode rather than be transferred to the floating diffusion. This is sometimes referred to as "spill-back" or "slosh-back." This incomplete charge transfer can affect the amount of charge accumulated and transferred during the next integration period, producing image lag or temporal noise.

Subsurface leakage occurs during integration when electrons move from the photodiode region to the floating diffusion. Such leakage will result in an inaccurate reading of the amount of charge collected during an integration period, thereby reducing the image quality.

While the above described structure is generally effective at reducing dark current by implanting the whole of the charge transfer region with a dopant to enhance its conductivity relative to the substrate, such a structure does not address issues of subsurface leakage current and image lag due to charge spill-back.

SUMMARY

In one aspect, the present invention provides a pixel including a substrate of a first conductivity type and having a surface, a photodetector of a second conductivity type that is opposite the first conductivity type, a floating diffusion region of the second conductivity type, a transfer region between the photodetector and the floating diffusion, a gate positioned above the transfer region and partially overlapping the photodetector, and a pinning layer of the first conductivity type extending at least across the photodetector from the gate. A channel implant of the first conductivity type extending from between a midpoint of the transfer gate and the floating diffusion to at least across the photodiode and having a dopant concentration such that a dopant concentration of the transfer region is greater proximate to the photodetector than the floating diffusion, and wherein a peak dopant concentration of the channel implant is at a level and at a depth below the surface such that a partially-buried channel is formed in the transfer region between the photodiode and floating diffusion when the transfer gate is energized.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
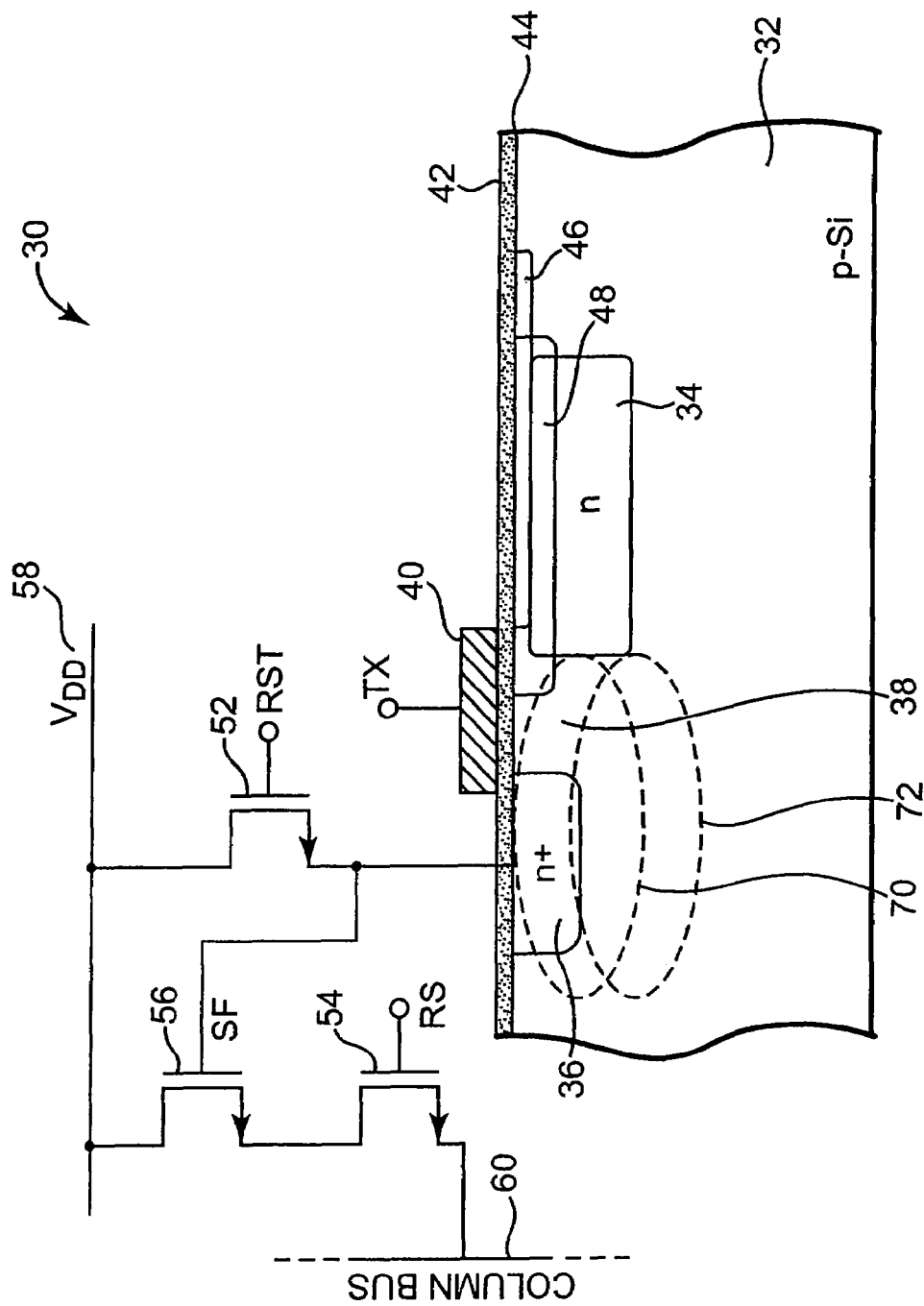
FIG. 1 is a block and schematic diagram illustrating one embodiment of a pixel according to the present invention.

FIG. 1 is a block diagram and schematic diagram illustrating generally one embodiment of CMOS pixel 30 employing asymmetric channel doping according to the present invention. Pixel 30 includes a substrate 32 of a first conductivity type, and photodetector 34 formed from an implant of a second conductivity type, which is opposite the first conductivity type, and is configured to collect and convert incident light to a charge during an integration period. Photodetector 34 may be a photodiode or a pinned-photodiode. CMOS pixel 30 as illustrated is commonly referred to as a 4-transistor, buried-gated photodiode type pixel, wherein photodetector 34 comprises a pinned-photodiode.

A floating diffusion region 36 is formed in substrate 32 of an implant having the second conductivity type. A transfer region 38 of substrate 32 extends between photodiode 34 and floating diffusion 36. A transfer gate (TX) 40 (sometimes referred to as an access transistor) is formed above transfer region 38 and at least partially overlaps photodiode 34. An insulating layer 42 separates TX gate 40 from a surface 44 of substrate 32. A pinning layer 46 of the first conductivity type is positioned generally between surface 44 and photodetector 34 and extends from TX gate 40 at least across photodiode 34.

A channel region 48 of enhanced conductivity type relative to substrate 32 is at least partially coincident with and at least partially at a depth greater than pinning layer 46. Channel region 48 extends generally from a midpoint of TX gate 40 to at least across photodiode 34 such that channel region 48 forms a junction with photodiode 34. Channel region is formed with a dopant concentration such that a dopant concentration of transfer region 38 is greater proximate to photodiode 34 than proximate to floating diffusion 36. In effect, transfer region 38 is asymmetrically doped with a dopant of the same conductivity type as substrate 32 with the dopant concentration being greater adjacent to photodiode 34 than adjacent to floating diffusion 36.

In one embodiment, as illustrated, substrate 32 is of p-type conductivity (e.g. p-type silicon) and photodiode 34 and floating diffusion 36 are of n-type conductivity. In one embodiment, pinning layer 46 and channel region 48 include additional dopant of the same type as substrate 32, p-type as illustrated. In one embodiment, the dopant of substrate 32, pinning layer 46, and channel region 48 comprises boron. In one embodiment, the dopant of substrate 32, pinning layer 46, and channel region 48 is selected from the group consisting of boron, aluminum, gallium, and indium. In one embodiment, the dopant of photodiode 34 and floating diffusion 36 comprise phosphorous. In one embodiment, the dopant of photodiode 34 and floating diffusion area is selected from the group consisting of phosphorous and arsenic.

Pixel 30 further includes a reset (RST) transistor 52, a row select (RS) transistor 54, and a source-follower (SF) transistor 56. The source of reset transistor 52 is coupled to floating diffusion 36 and the drain is coupled to a voltage source ($V_{DD}$) 58. The gate of SF transistor 56 is coupled to the source of RST transistor 52 and the drain is coupled to $V_{DD}$ 58. The drain of RS 54 is coupled to the source of SF transistor 56 and the gate is coupled to a column bus 60 of an array of image sensor to which pixel 30 is associated. Pixel 30 operates essentially in two modes, integration and readout. Initially, pixel 30 is in a reset state, with TX gate 40 and RST gate 52 turned on so as to remove charge from photodiode 34 and floating diffusion 36. To begin integrating, TX gate 40 and RST transistor 52 are turned off. During integration, photodiode 34 collects photo-generated electrons having a charge that is proportional to an amount of photon flux incident upon photodiode 34. The amount of accumulated charge is representative of the intensity of light incident up photodiode 34. During integration, the boron implants of channel region 48 and pinning layer 46 function as a barrier to prevent carrier generation near surface 44.

After pixel 30 has integrated charge for a desired period, RST transistor 52 is turned on and floating diffusion 36 is set to a level approximately equal to $V_{DD}$ 58. In one embodiment, $V_{DD}$ 58 is in a range from 2.5 volts to 5 volts. In one embodiment, $V_{DD}$ 58 is approximately 3.3 volts. The reset level of floating diffusion 36 is then sampled at column bus 60 via RS transistor 54 and SF transistor 56, with the reset level being approximately equal to $V_{DD}$ 58 minus a threshold value.

Subsequently, the voltage on TX gate 40 is set high forming an inversion layer in transfer region 38 and causing transfer region 38 to become conductive. As a result, electrons accumulated by photodiode 34 begin to be transferred to from the lower voltage photodiode 34 to the higher voltage floating diffusion 36 via transfer region 38 causing the voltage level of floating diffusion 36 to drop. At the end of the transfer period, the TX gate 40 is returned to ground to isolate photodiode 34 for the next integration period. The "accumulated" voltage level of floating diffusion 36 is then read at column bus 60 via RS transistor 54 and SF transistor 56. The difference between the sampled reset level and the accumulated voltage level constitutes an image signal that is proportional to the intensity of light incident upon photodiode 34. The process of comparing the sampled reset level to the accumulated voltage level is generally referred to as "double sampling."

During the readout period, as electrons are transferred from photodiode 34 to floating diffusion 36, the potential of floating diffusion 36 begins to drop from the reset level while the potential of photodiode 32 begins to rise. If the potential difference between photodiode 34 and floating diffusion 36 is not substantial when TX gate 40 is returned to ground, electrons located in transfer region 38, and possibly electrons in floating diffusion 36, may return to photodiode 34 and not be included in the image signal. The return of photo-generated electrons to the photodiode in this fashion is sometimes referred to as charge "slosh-back." Such slosh-back results in "image lag", wherein the returning electrons of the present integration period are included with photo-generated electrons of the next integration period, thereby reducing image quality.

The asymmetric doping of transfer region 38 resulting from implantation of channel region 48 in accordance with the present invention is configured to reduce and/or eliminate such charge slosh-back. During operation of pixel 30, the implanted p-type dopants, such as boron, for example, are negatively charged immobile ions. Because of the asymmetry of the dopant implants, the higher concentrations of dopant adjacent to photodiode 34 create an electrostatic potential in transfer region 38 adjacent to photodiode 34 that is lower than an electrostatic potential adjacent to floating diffusion 36 created by the lower concentrations of dopant adjacent to floating diffusion 36. As a result, photo-generated electrons in transfer region 38 flow to the higher potential and, thus, to floating diffusion 36 when the voltage of TX gate 40 is returned to ground from a high voltage at completion of the charge transfer process.

In effect, the asymmetrical doping of transfer region 38 "pushes" photo-generated electrons to floating diffusion 36, with the higher dopant concentrations of channel region 48 forming a barrier to photodiode 48 from transfer region 38. It should be noted that by extending channel region 48 from transfer region 38 to at least across photodiode 32, channel region 48 presents a substantially uniform potential to photodiode 34. As such, the likelihood of channel region 48 being a potential barrier to electron flow from photodiode 34 during the charge transfer process is reduced and electrons are able to flow freely to floating diffusion 36.

It should also be noted that while some pixel structures include surface doping of the transfer region, such doping is generally symmetrical across the transfer region so as to reduce generation of dark current in the transfer region. As such, the symmetrical surface doping of the transfer regions of conventional pixel structures does not reduce charge slosh-back as does the asymmetric doping of transfer region 38 according to the present invention.

In one embodiment, pixel 30 further includes an asymmetric anti-punchthrough implant of the same conductivity as substrate 32. In one embodiment, the anti-punchthrough implant comprises boron. In one embodiment, as illustrated, the asymmetric anti-punchthrough implant includes a medium anti-punchthrough implant 70 and a deep anti-punchthrough implant 72 as represented generally by the dashed lines in FIG. 1. In one embodiment, the medium and deep anti-punchthrough implants 70 and 72 are implanted such that the doping extends from approximately the center of TX gate 40 into floating diffusion region 36, thereby making the anti-punchthrough implants asymmetric across the width of pixel 30.

The use of anti-punchthrough implants is known and employed in some conventional pixel structures to reduce subsurface leakage of electrons generated from incident light in the region of the photodiode to the floating diffusion region. Such leakage of photo-generated electrons to the floating diffusion will result in an inaccurate image signal since not all photo-generated electrons will be collected by the photodetector and, consequently, not included and measured as part of the charge transfer process.

While anti-punchthrough implants of conventional pixel structures are generally effective at reducing sub-surface leakage, such implants are generally symmetrically implanted across the pixel including in the region of the photodetector. Thus, although effective at reducing sub-surface leakage, the implants in the region of the photodetector can interfere with the collection of photo-generated electrons by the photodetector, particularly those electrons generated deeper in the substrate.

On the other hand, the medium and deep anti-punchthrough implants 70 and 72 of the present invention are asymmetrically implanted such that concentrations of implanted dopant (e.g. boron) are greater proximate to floating diffusion 36 than concentrations adjacent to photodiode 34. In a fashion similar to that described above with respect to transfer region 38, the higher concentrations of dopant proximate to floating diffusion 36 create a lower electrostatic potential relative to the lower concentrations of dopant adjacent to photodiode 34. As such, medium and deep asymmetrical anti-punchthrough implants 70 and 72 act as an electron barrier to floating diffusion 36 and "push" photo-generated electrons toward photodiode 34. Furthermore, since medium and deep anti-punchthrough implants 70 and 72 generally do not extend into photodiode 34, they do not interfere with the collection of photo-generated electrons as do conventional symmetrical anti-punchthrough implants.

In summary, by creating an asymmetrical doping of transfer region 38 through use of channel region 48 according to the present invention, pixel 30 reduces the occurrence of charge slosh-back, thereby improving image quality by reducing the effects of image lag. Additionally, by employing asymmetrical anti-punchthrough implants 70 and 72 in accordance with the present invention, pixel 30 further improves image by reducing sub-surface leakage of electrons without interfering with the collection of photo-generated electrons by photodiode 34.

Figure 2:
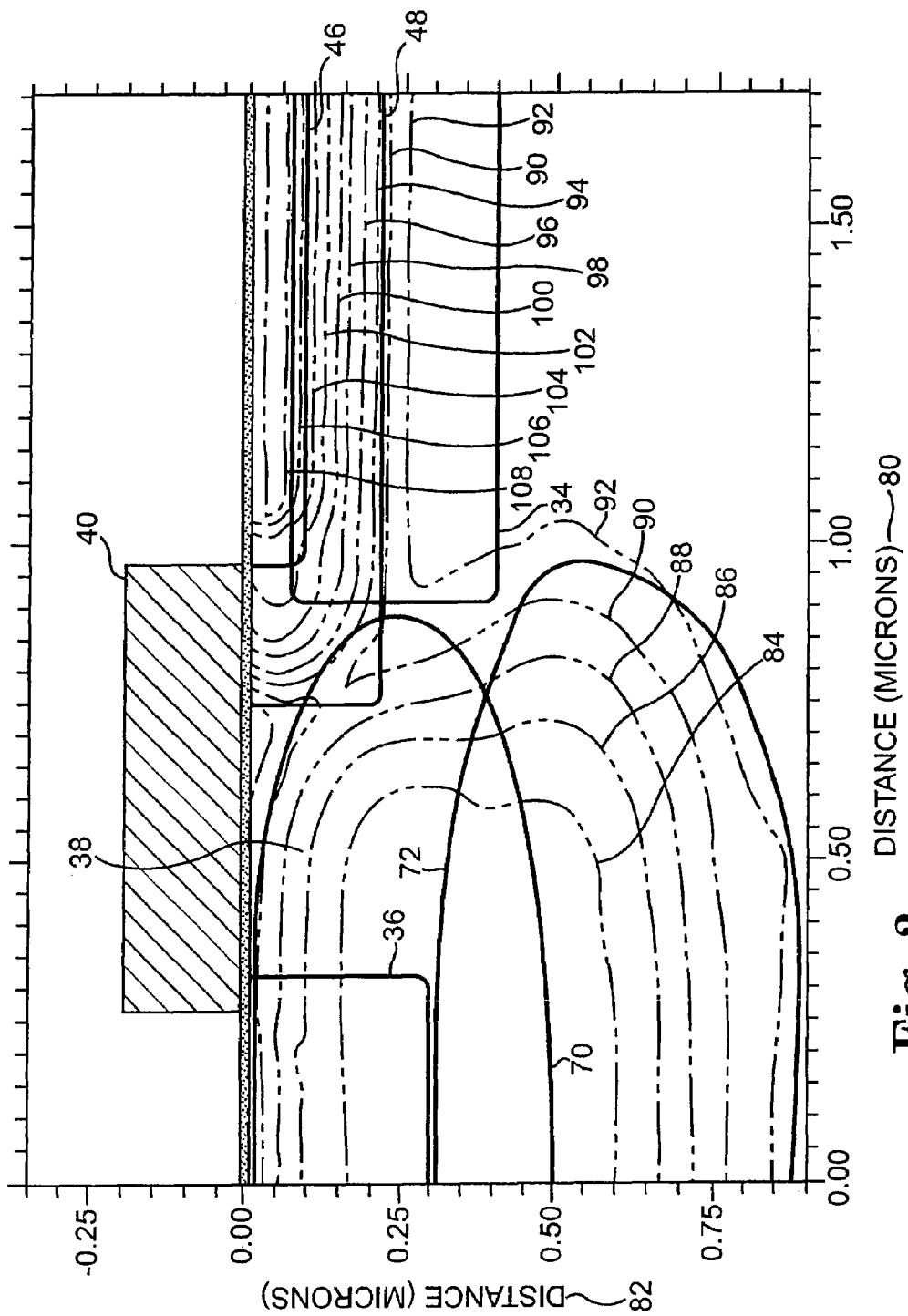
FIG. 2 is a cross-sectional view of a portion of the pixel of FIG. 1 illustrating example dopant concentration contours.

FIG. 2 is a cross-sectional view of a portion of pixel 30 of FIG. 1 illustrating example contours of boron concentration levels in substrate 32 used to create the asymmetrically doping of transfer region 38 and anti-punchthrough implants 70 and 72. The distance (as measured in microns) across the width of pixel is indicated along the x-axis at 80, and the depth (as measured in microns) below surface 44 of pixel 30 is indicated along the y-axis as indicated at 82.

In FIG. 2, photodiode 34, floating diffusion 36, pinning layer 46, channel region 48, and medium and deep anti-punchthrough implants 70 and 72 are illustrated with solid lines, while boron contour lines. 84 through 108 are illustrated with hidden lines. Although the boundaries of photodiode 34 are illustrated by FIGS. 1 and 2 as being generally perpendicular to surface 44 of substrate 32, in one embodiment, the edge of the implant forming photodiode 34 which is proximate to TX gate 40 is angled generally toward a middle region of TX gate 40 such that photodiode 34 angularly extends below TX gate 40.

Implant concentrations are typically measured in terms of the number of implanted dopant atoms per cubic centimeter ($cm^3$) of volume of the substrate. In one embodiment, boron contour line 84 represents a region having a boron concentration of $4.6 \times 10^{16}$ boron atoms per cubic centimeter of substrate 32 ($4.6e16/cm^3$), contour line 86 a boron concentration of $2e16/cm^3$, contour line 88 a boron concentration of $1e16/cm^3$, contour line 90 a boron concentration of $4.6e15/cm^3$, contour line 92 a boron concentration of $2e15/cm^3$, contour line 94 a boron concentration of $1e16/cm^3$, contour line 96 a boron concentration of $2e16/cm^3$, contour line 98 a boron concentration of $4.6e16/cm^3$, contour line 100 a boron concentration of $1e17/cm^3$, contour line 102 a boron concentration of $2e17/cm^3$, contour line 104 a boron concentration of $4.6e17/cm^3$, contour line 106 a boron concentration of $1e18/cm^3$, and contour line 108 a boron concentration of $2e18/cm^3$.

In the example illustrated by FIG. 2, it can be seen that the boron concentrations of channel region 46 together with the boron concentrations of medium and deep anti-punchthrough implants 70 and 72 provide a transfer region 38 having a higher boron concentration adjacent to photodiode 34 than to floating diffusion 36, and anti-punchthrough implants having higher boron concentrations in the region of floating diffusion 36 than adjacent to photodiode 34.

It is noted that the boron concentrations illustrated by FIG. 2 represent a specific implementation of pixel 30. Other concentrations of boron and other dopant implants can also be employed. In one embodiment, the implant concentrations are such that the dopant concentration of transfer region 38 proximate to photodiode 34 is in a range from $1.5 \times 10^{18}/cm^3$ to $4.5 \times 10^{18}/cm^3$. In one embodiment, the implant concentrations are such that the dopant concentration of transfer region 38 proximate to floating diffusion 36 is in a range from $7.0 \times 10^{15}/cm^3$ to $1.3 \times 10^{16}/cm^3$. In one embodiment, the implant concentrations are such that a ratio of the dopant concentration proximate to photodiode 34 to the dopant concentration proximate to floating diffusion 36 is in a range approximately from 150 to 650.

Figure 3A:
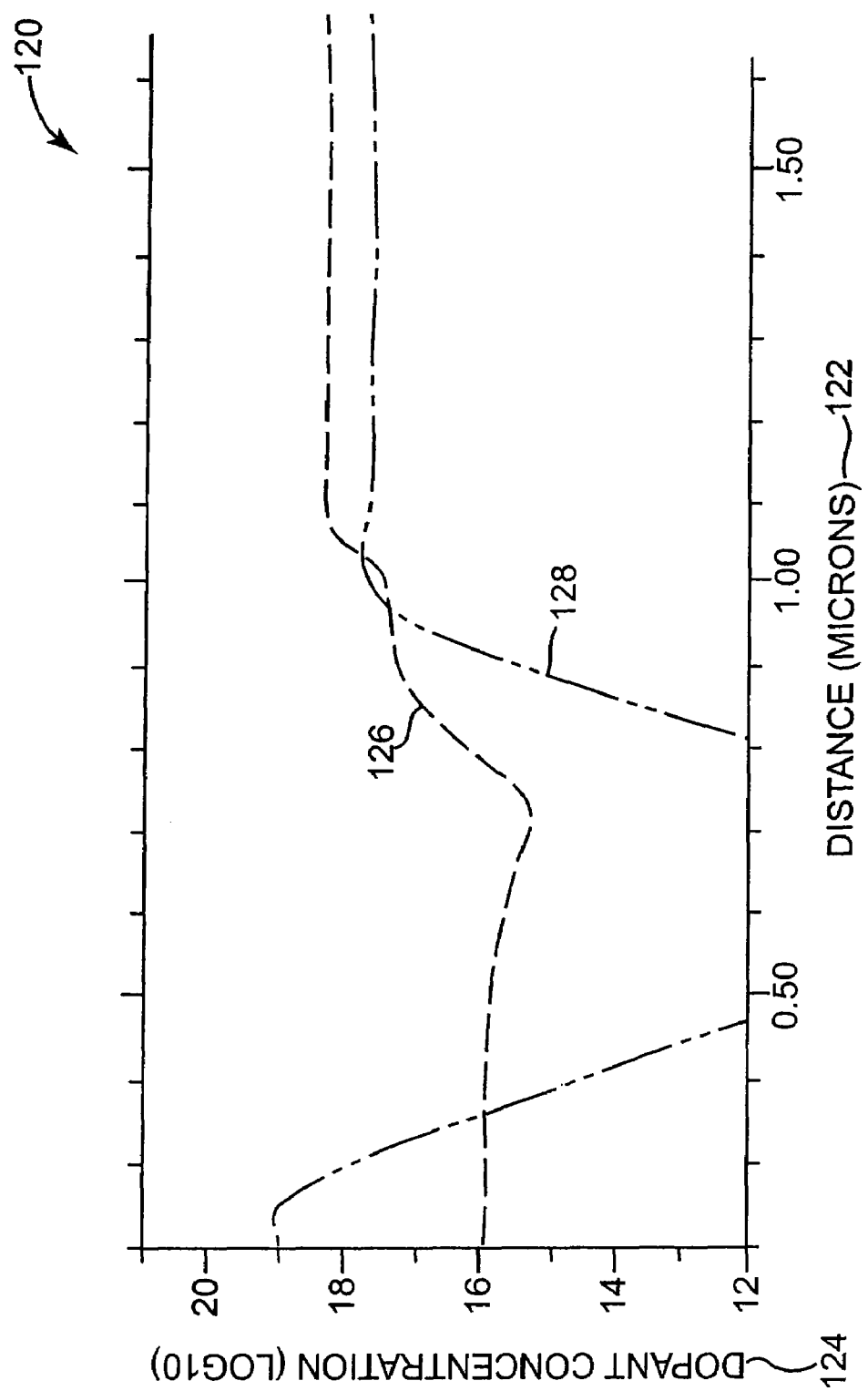
FIG. 3A is a graph illustrating example concentrations of implanted boron and phosphorous at a constant depth across the pixel of FIG. 2.

FIG. 3A is a graph 120 illustrating example boron concentrations at a constant depth of approximately 0.05 microns across a width pixel 30 from 0.30 microns to 1.50 microns. The distance (in microns) across the width of pixel 30 is illustrated along the x-axis at 122 and the implant concentration is illustrated along the y-axis at 124. The boron concentration level is indicated by curve 126. A phosphorous concentration level is indicated by curve 128. For purposes of clarity, phosphorous contour lines were not illustrated in FIG. 2. However, the n-type phosphorous implants are illustrated in FIG. 3A to illustrate the relationship between the boron implants and the phosphorous implants used to form photodiode 34 and floating diffusion 36.

Figure 3B:
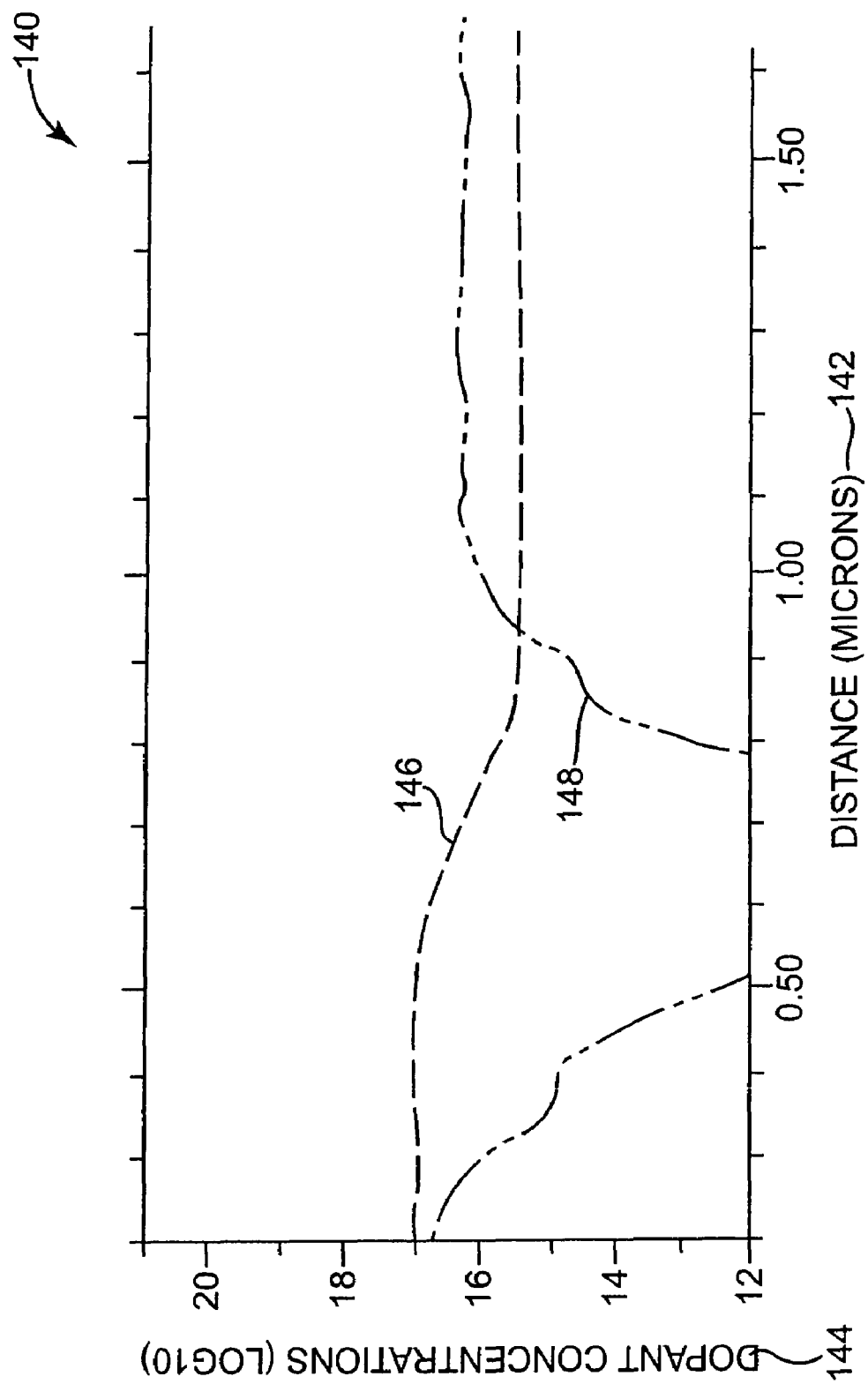
FIG. 3B is a graph illustrating example concentrations of implanted boron and phosphorous at a constant depth across the pixel of FIG. 2.

FIG. 3B is a graph 140 illustrating example boron concentrations at a constant depth of approximately 0.25 microns across a width pixel 30 from approximately 0.30 microns to 1.50 microns. The distance (in microns) across the width of pixel 30 is illustrated along the x-axis at 142 and the implant concentration is illustrated along the y-axis at 144. The boron concentration level is indicated by curve 146. A phosphorous concentration level is indicated by curve 148. For purposes of clarity, phosphorous contour lines were not illustrated in FIG. 2. However, the n-type phosphorous implants are illustrated in FIG. 3B to illustrate the relationship between the boron implants and the phosphorous implants used to form photodiode 34 and floating diffusion 36.

Figure 3C:
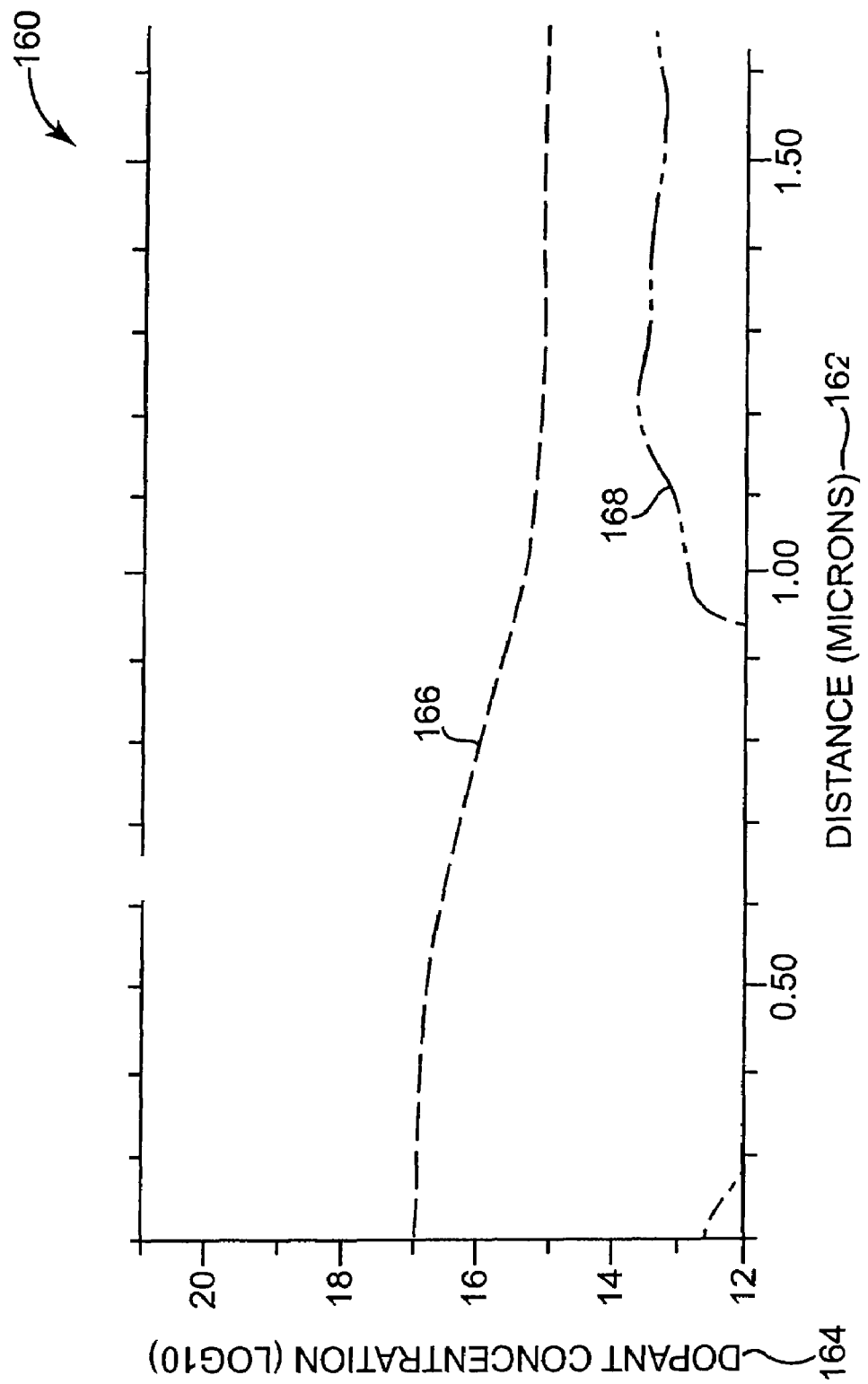
FIG. 3C is a graph illustrating example concentrations of implanted boron and phosphorous at a constant depth across the pixel of FIG. 2.

FIG. 3C is a graph 160 illustrating example boron concentrations at a constant depth of approximately 0.5 microns across a width pixel 30 from 0.30 microns to 1.50 microns. The distance (in microns) across the width of pixel 30 is illustrated along the x-axis at 162 and the implant concentration is illustrated along the y-axis at 164. The boron concentration level is indicated by curve 166. A phosphorous concentration level is indicated by curve 168. For purposes of clarity, phosphorous contour lines were not illustrated in FIG. 2. However, the n-type phosphorous implants are illustrated in FIG. 3A to illustrate the relationship between the boron implants and the phosphorous implants used to form photodiode 34 and floating diffusion 36.

It should be noted that the implantation of channel region 48 and anti-punchthrough regions 70 and 72 of the present invention comprises a two step masking operation. A first mask is employed in the formation of channel region 48 and a second mask is employed in the formation of medium and deep anti-punchthrough implants 70 and 72. In one embodiment, a boron ion beam is employed to implant the boron atoms in the formation of pinning layer 46, channel region 48, and medium and deep anti-punchthrough implants 70 and 72. In one embodiment, pinning layer 46 is formed with a boron ion beam having an energy level of approximately 20 KeV and channel region 48 is formed with a boron ion beam having an energy level of approximately 41 KeV. Similarly, deep anti-punchthrough implant 72 is formed with a boron ion beam having a higher energy level than that used to form medium anti-punchthrough implant 70. In one embodiment, medium anti-punchthrough implant 70 has a peak boron concentration at a depth of 0.3 microns from surface 44 and deep anti-punchthrough implant 72 has a peak boron concentration at a depth of 0.6 microns from surface 44.

Generally, to reduce costs and manufacturing time, the transfer region implants and anti-punchthrough implants of conventional pixel structures are formed using the same mask. Thus, when using the same mask, great care must be taken to properly align the mask since the transfer region implant is desired to be as close as possible to the photodiode to reduce dark current while the anti-punchthrough implant is desired to be spaced at least some distance from the photodiode to prevent interference with its operation. As such, aligning the mask optimally is a problem. Furthermore, because the same mask is used for both implants and because it is desired to implant the transfer region with a symmetrical implant to reduce dark current, the anti-punchthrough implant is symmetrical as well. As described earlier, such a symmetrical configuration can interfere with collection of photogenerated electrons by the photodiode.

By using two masks, one in the formation of channel region 48 and one in the formation of medium and deep anti-punchthrough implants 70 and 72, the present invention avoids these problems. The first mask can be optimally placed to form channel region 48 and the second mask can be optimally placed to form anti-punchthrough implants 70 and 72. Furthermore, anti-punchthrough implants 70 and 72 are not limited to being symmetrical across a width of pixel 30.

Figure 4:
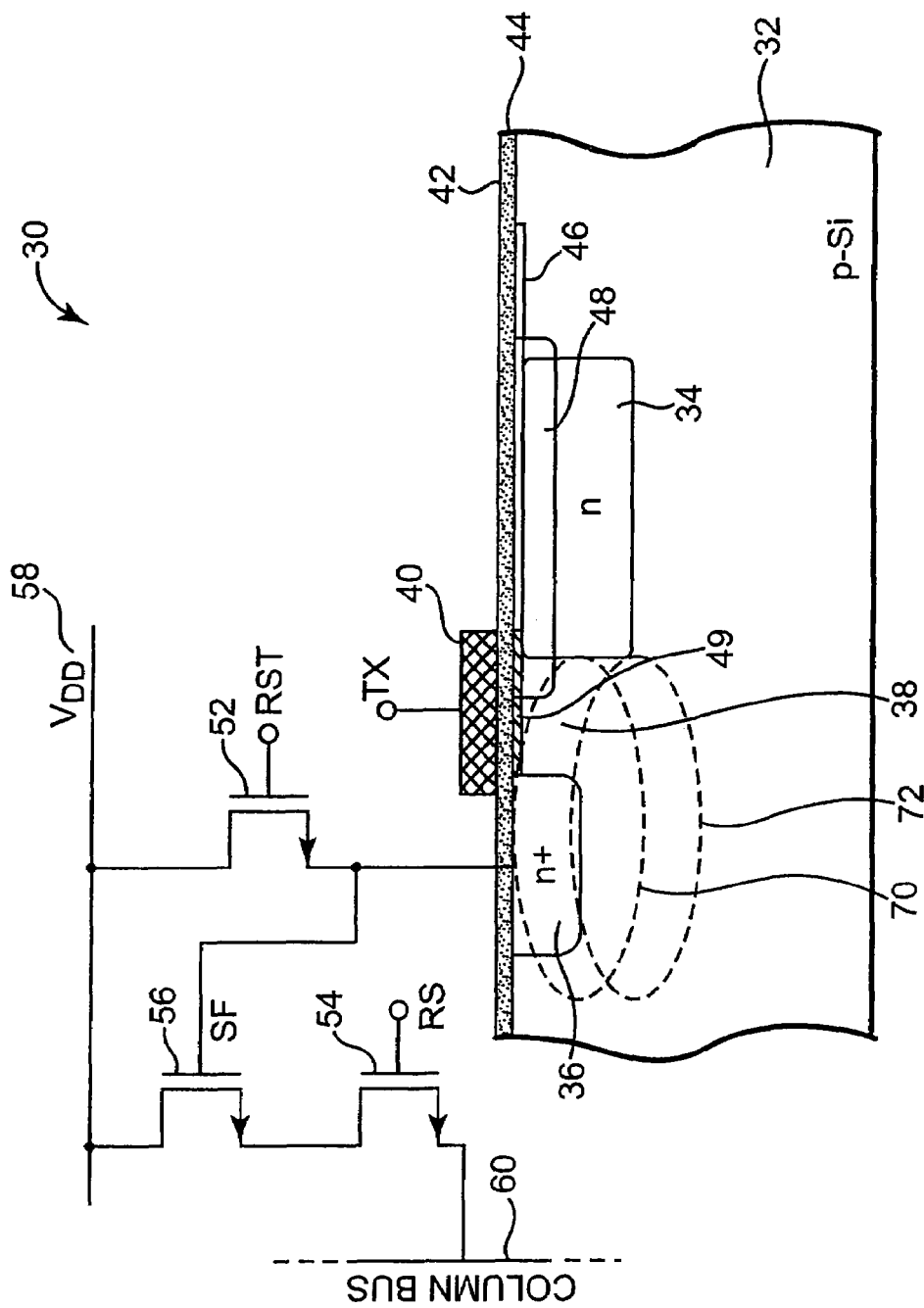
FIG. 4 is a block and schematic diagram illustrating one embodiment of a pixel having an asymmetrically doped, surface channel transfer gate.

Pixel 30 described and illustrated above by FIGS. 1-3C employs what is generally referred to as a surface channel transfer gate structure for transferring accumulate charge from the photodiode to the floating diffusion region. FIG. 4 is a block and schematic diagram illustrating generally the charge transfer or read out operation of pixel 30. As described above, during a charge transfer operation, the voltage on TX gate 40 is set "high" which forms an inversion layer in transfer region 38. The inversion layer forms a conductive surface channel 49, as indicated by the hatched area in FIG. 4, through which accumulated charge is transferred from photodiode 34 to floating diffusion 32 during a charge transfer operation. In one embodiment, surface channel 49 extends to a depth below surface 44 of substrate 32 that ranges from approximately 0.01 to 0.02 microns.

Although the asymmetric doping of surface channel 49 created by implant 48 substantially reduces and/or eliminates charge slosh-back from surface channel 49 to photodiode 34 during a charge transfer operation, the shallow depth of surface channel 49 requires that the photodiode 34 be relatively shallow as well so as to ensure complete charge transfer from photodiode 34 to floating diffusion 36. If photodiode 34 is too deep, photo-generated charge may not be able to reach surface channel 49 during a transfer operation and result in image lag or ghosting artifacts.

As such, the implant energy used to form photodiode 34 must not be too high when employing a surface channel transfer gate configuration, as illustrated by pixel 30 of FIGS. 1-4 above, which restricts the maximum full-well capacity attained by photodiode 34. Additionally, the lower implant energy results in higher doping levels on each side of the top junction of the photodiode which causes a higher electric field at the top junction and results in a deterioration of the pixel's "hot pixel performance." Hot pixel performance typically refers to a percentage of pixels with significantly higher (e.g. >5-6×) dark current as compared to a mean dark current in a given sensor array.

Figure 5:
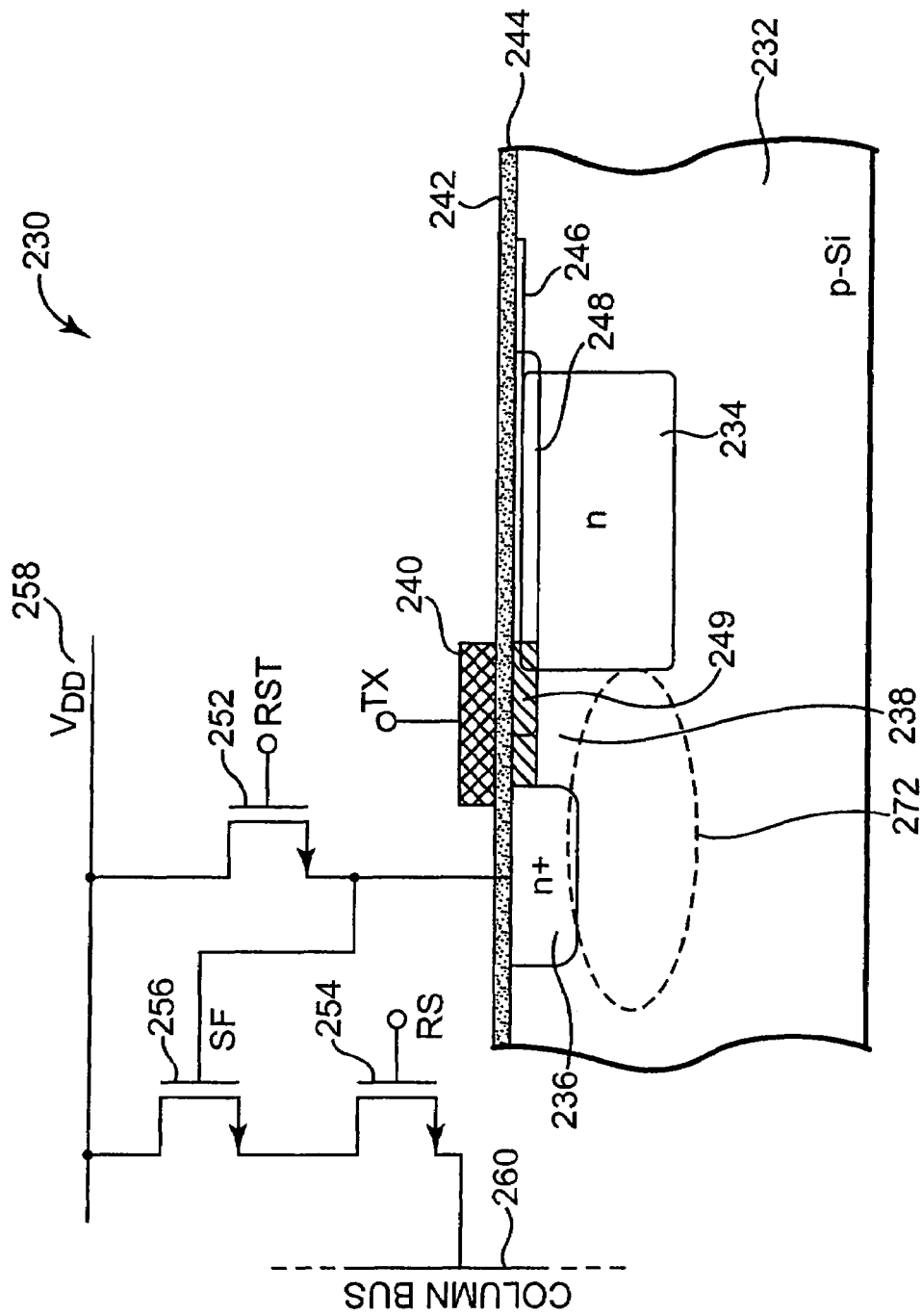
FIG. 5 is a block and schematic diagram illustrating one embodiment of a pixel having an asymmetrically doped, partially-buried channel transfer gate.

FIG. 5 illustrates generally one embodiment of a CMOS pixel 230 employing an asymmetrically-doped partially-buried channel transfer gate in accordance with the present invention. Pixel 230 is similar in configuration to pixel 30 of FIG. 1 and includes a substrate 232 of a first conductivity type and a photodetector 234 formed by an implant of a second conductivity type, which is opposite the first conductivity type, and configured to collect and convert incident light to a charge during an integration period. Photodetector 234 may comprise a photodiode or a pinned photodiode. As illustrated, CMOS pixel 230 is commonly referred to as a 4-transistor, buried-gate photodiode type pixel, wherein photodetector 34 comprises a pinned-photodiode.

A floating diffusion region 236 is formed in substrate 232 of an implant having the second conductivity type. A transfer region 238 of substrate 232 extends generally between photodiode 234 and floating diffusion region 236. A transfer gate (TX) 40 is formed above transfer region 238 and is positioned at least partially over photodiode 234. An insulating layer 242 is positioned between a surface 244 of substrate 232 and transfer gate 240.

In one embodiment, similar to deep anti-punchthrough implant 72 of pixel 30, pixel 230 further includes a deep anti-punchthrough implant 272 of enhanced conductivity relative to substrate 232, as illustrated by the dashed elliptical outline in FIG. 5. In one embodiment, deep anti-punchthrough implant 272 comprises boron. In one embodiment, deep anti-punchthrough implant 272 is implanted such that the doping extends from approximately a center of TX gate 240 into floating diffusion region 236.such that anti-punchthrough implant 272 is asymmetric across transfer region 238. However, unlike pixel 30 described above, pixel 230 does not employ a medium anti-punchthrough implant, such as medium anti-punchthrough implant 70 with respect to FIG. 1.

Pixel 230 further includes a reset (RST) transistor 252, a row select (RS) transistor 254, and a source-follower (SF) transistor 256. The source of reset transistor 252 is coupled to floating diffusion 236 and the drain is coupled to a voltage source ($V_{DD}$) 258. The gate of SF transistor 256 is coupled to the source of RST transistor 252 and the drain is coupled to $V_{DD}$ 258. The drain of RS 254 is coupled to the source of SF transistor 256 and the gate is coupled to a column bus 260 of an array of image sensors to which pixel 230 is associated.

Similar to channel implant region 48 of pixel 30 as illustrated by FIGS. 1-4 above, pixel 230 includes a channel implant region 248 of enhanced conductivity type relative to substrate 232, with channel implant region 238 being at least partially coincident with and at a depth greater than pinning layer 246. In one embodiment, channel implant region 248 comprises boron. In one embodiment, as illustrated, channel implant region 248 extends generally from beyond a midpoint of TX gate 240 to at least across photodiode 234 such that channel implant region 248 forms a junction with photodiode 234. Channel implant region 248 is formed with a dopant concentration of the first conductivity type such that a dopant concentration of transfer region 238 is greater proximate to photodiode 234 than proximate to floating diffusion 236. In effect, transfer region 238 is asymmetrically doped with a dopant of the same conductivity type as substrate 322 such that the dopant concentration is greater adjacent to photodiode 234 than to floating diffusion region 236.

However, unlike pixel 30, channel implant region 248 of pixel 230 is formed at a shallower depth and with a higher dopant concentration relative to channel implant region 48 of pixel 30. For example, in one embodiment, channel implant region 248 has a peak boron concentration in a range from approximately $1e17/cm^3$ to $5e17/cm^3$ at a depth in a range from approximately 0.03 to 0.06 microns. By comparison, in one embodiment, channel implant region 48 of pixel 30 has a peak boron concentration ranging from approximately $8e16/cm^3$ to $2e17/cm^3$ at a depth ranging from approximately 0.04 to 0.05 microns.

As a result of employing channel implant region 248 which is implanted at a shallower depth and at a higher dopant concentration relative to channel implant region 48 of pixel 30 and by not employing a medium anti-punchthrough implant similar to medium anti-punchthrough implant 70 (as illustrated by FIG. 1), pixel 230 of FIG. 5 forms a partially-buried channel 249, as illustrated by the hatched lines, when a voltage is applied to TX gate 240 during a charge transfer operation. In one embodiment, partially buried channel 249 extends to a depth below surface 244 of substrate 232 that ranges from approximately 0.02 to 0.03 microns. By comparison, in one embodiment, surface channel 49 of pixel 30 extends to a depth below surface 44 of substrate 32 that ranges from approximately 0.01 to 0.02 microns. By forming partially buried channel 249 at a depth below surface 44 of substrate 232 which is greater than the depth of surface channel 49 of pixel 30, the efficiency of charge transfer from photodiode 234 to floating diffusion region 236 is enhanced relative to pixel 30. As a result, pixel 230 of FIG. 5 can employ a photodiode 234 that is implanted to a greater depth than photodiode 34 of pixel 30. In one embodiment, photodiode 234 extends below surface 244 of substrate 232 to a depth that ranges from approximately 0.30 to 0.45 microns. In other embodiments, photodiode 234 may extend to depths greater than 0.45 microns. By comparison, in one embodiment, photodiode 34 of pixel 30 extends to a depth that ranges from approximately 0.30 to 0.35 microns below surface 44. In other embodiments, photodetector 34 of pixel 30 may extend to depths greater than 0.35 microns, but for reasons described above, is generally at a shallower depth relative to photodetector 234 of pixel 230.

Also, due to its deeper depth, photodiode 234 of pixel 230 is able to employ a lower dopant concentration than photodiode 34 of pixel 30. For example, in one embodiment, photodiode 234 employs comprises a peak phosphorous concentration in a range from approximately $2e16/cm^3$ to $3e16/cm^3$. By comparison, in one embodiment, photodiode 34 of pixel 30 comprises a peak phosphorous concentration in a range from approximately $3e17/cm^3$ to $4e17/cm^3$.

By utilizing partially buried channel 249, which in-turn enables photodiode 234 to be deeper and have a lower dopant concentration, photodiode 234 has an improved full-well capacity relative to photodiode 34 of pixel 30, and pixel 230 has an improved hot pixel performance relative to pixel 30. In addition, in a fashion similar to that described above with respect to channel implant region 48 of pixel 30, the asymmetric doping of transfer region 238 resulting from channel implant 248 substantially reduces the occurrence of charge slosh-back, thereby further improving image quality.

In one embodiment, as illustrated, substrate 232 is of p-type conductivity (e.g. p-type silicon) and photodiode 234 and floating diffusion 236 are of n-type conductivity (e.g. phosphorous, arsenic). In one embodiment, as illustrated, the dopant of photodiode 234 and floating diffusion region 236 comprise phosphorous. In one embodiment, pinning layer 246 and channel region 248 include additional dopant of the same type as substrate 32, p-type as illustrated. In one embodiment, the dopant of substrate 232, pinning layer 246, and channel region 428 comprises a material of p-type conductivity such as boron, aluminum, gallium, and indium. In one embodiment, as illustrated, the dopant of substrate 232, pinning layer 246, and channel implant region 248 comprises boron. In one embodiment, the dopant of photodiode 234 and floating diffusion 236 comprise phosphorous.

Figure 6:
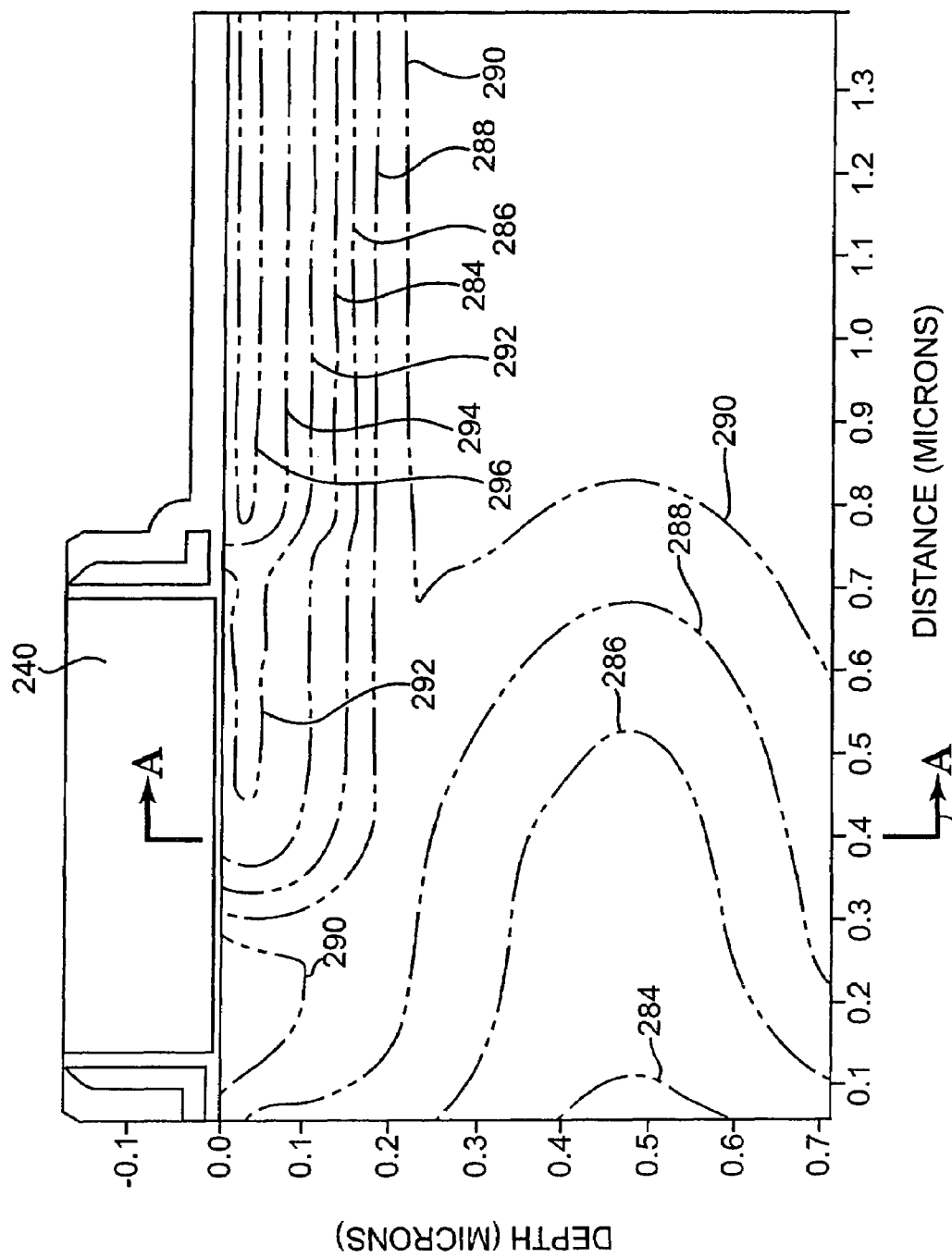
FIG. 6 is a cross-sectional view of the pixel of FIG. 5 illustrating example dopant concentration contours.

FIG. 6 is a cross-sectional view of a portion of pixel 230 of FIG. 5 illustrating one example of contours of boron concentration levels in substrate 232 of pixel 230. The distance across pixel 230 (as measured in microns) is indicated along axis 280, and the depth below surface 244 of substrate 232 (as measured in microns) is illustrated long the y-axis, as indicated at 282. Boron contour lines 284-296 are illustrated as dashed lines.

Implant concentrations are typically measured in terms of the number of implanted dopant atoms per cubic centimeter of substrate. In one embodiment, as illustrated by FIG. 6, contour line 284 represents a boron concentration of approximately $1e17/cm^3$, contour line 286 a boron concentration of approximately $3.2e16/cm^3$, contour line 288 a boron concentration of approximately $1e16/cm^3$, contour line 290 a boron concentration of approximately $3.2e15/cm^3$, contour line 292 a boron concentration of approximately $3.2e17/cm^3$, contour line 294 a boron concentration of approximately $1e18/cm^3$, and contour line 296 a boron concentration of approximately $3.2e18/cm^3$.

From FIG. 6, it can be seen that the boron concentrations of channel implant region 48 result in transfer region 38 having a higher boron concentration adjacent to photodiode 234 than to floating diffusion region 236, and that deep anti-punchthrough layer 272 results in a higher boron concentration adjacent to floating diffusion region 236 than to photodiode 234.

Figure 7:
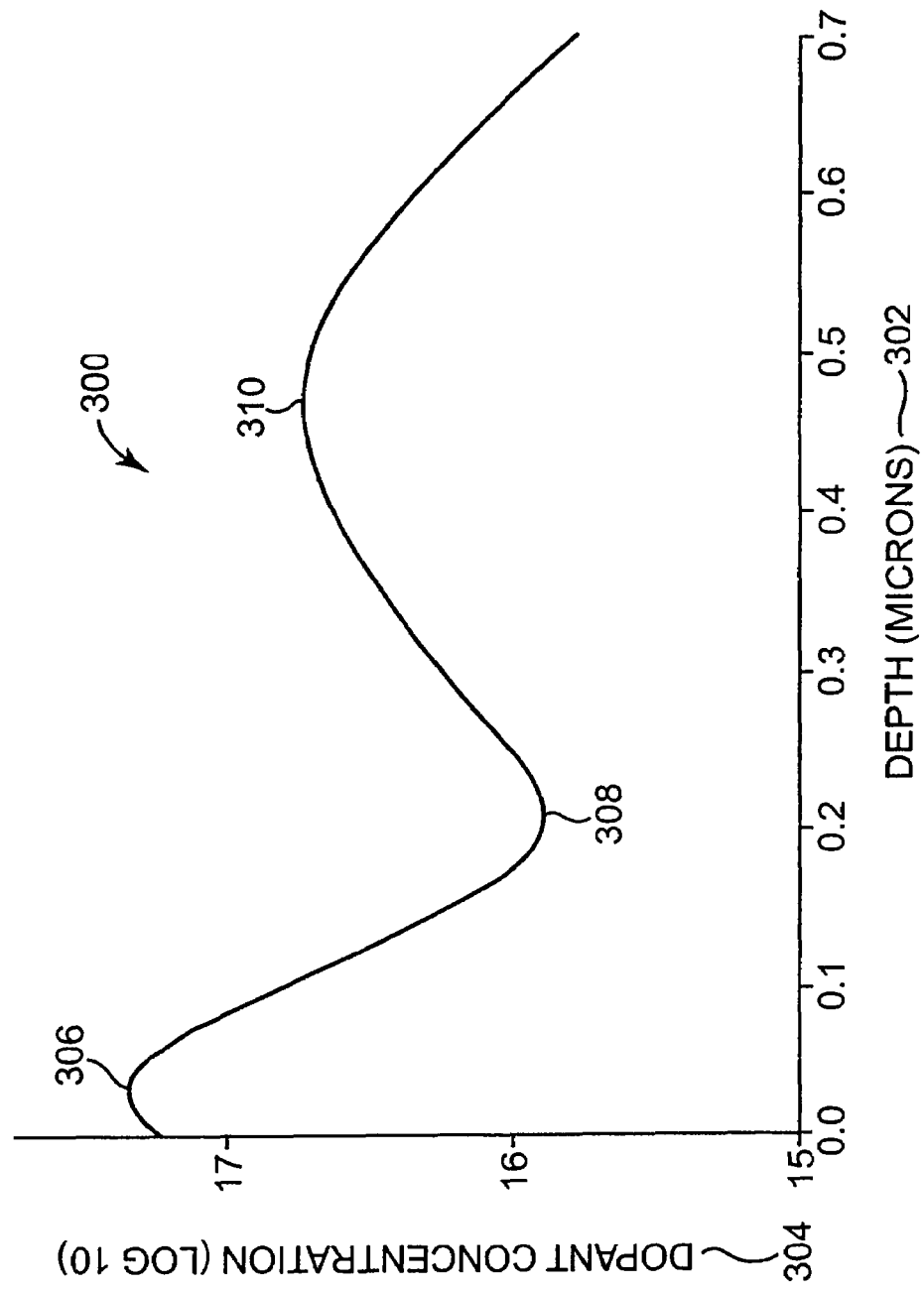
FIG. 7 is a graph illustrating dopant concentration levels at a section through the pixel of FIG. 6.

FIG. 7 is a curve 300 illustrating boron concentration levels of substrate 232 at a vertical section line A-A through pixel 230, as indicated at 298 in FIG. 6. Section A-A 298 corresponds approximately to a midpoint of TX gate 240. The depth below surface 244 of substrate 232 (as measured in microns) is illustrated long the x-axis, as indicated at 302, and the boron concentration (in log 10) is illustrated along the y-axis, as indicated at 304.

A first peak 306 at a depth of approximately 0.03 microns and a boron concentration of approximately $2.5e17/cm^3$ represents the peak boron concentration of channel implant region 248 at approximately the midpoint of TX gate 240. A valley 308 at a depth approximately 0.18 microns represents the boron concentration between photodiode 234 and floating diffusion 236, and is approximately equal to a doping of the epi substrate 232 due to the exclusion of the medium anti-punchthrough implant (e.g. medium anti-punchthrough implant 70 of pixel 30 in FIGS. 1 and 4)) from pixel 230. A second peak 310 at a depth of approximately 0.45 microns and a boron concentration of approximately $5e16/cm^3$ represents the boron implant of deep anti-punchthrough implant 272.

Figure 8:
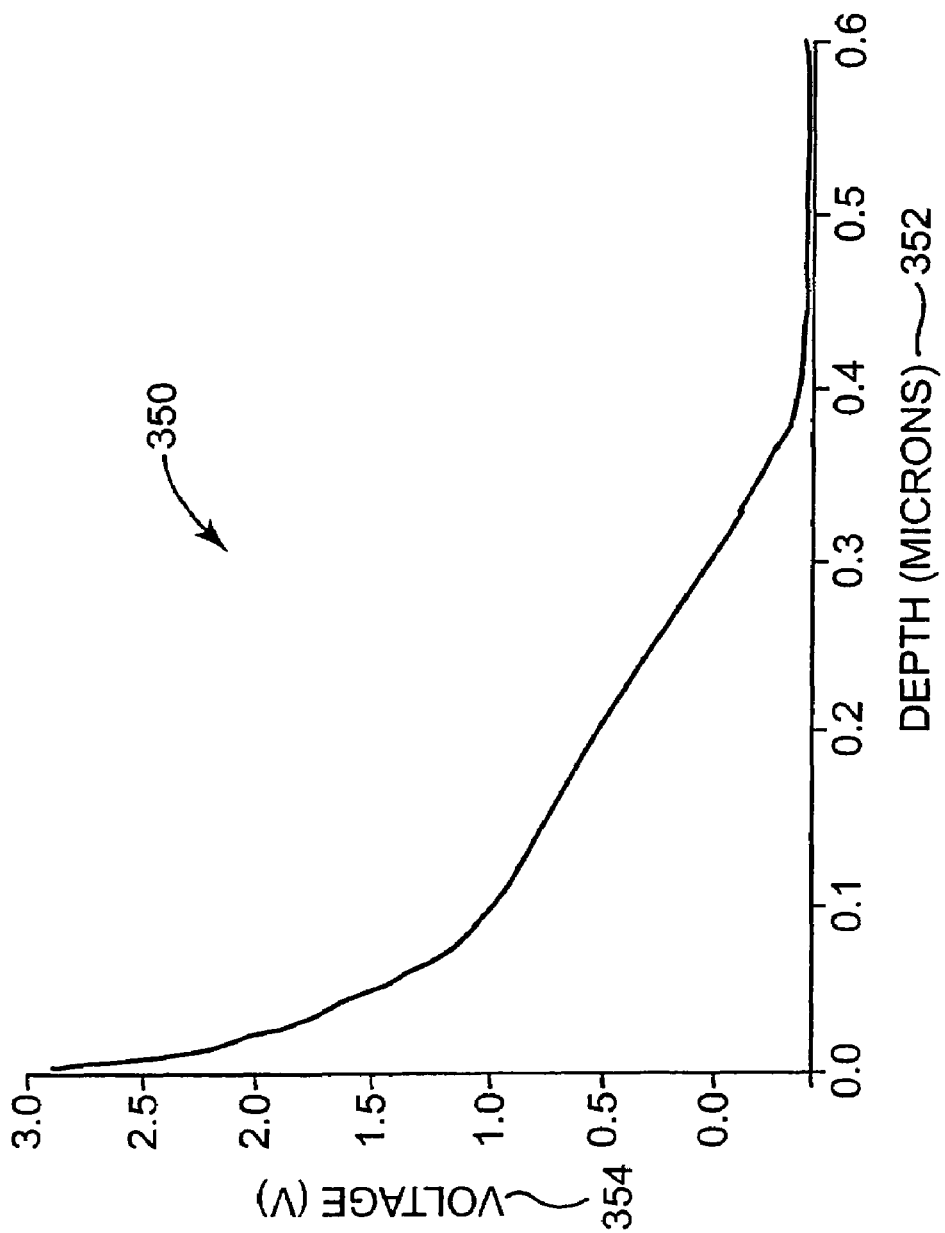
FIG. 8 is a graph illustrating potential levels at a section through the pixel of FIG. 6.

FIG. 8 is a curve 350 illustrating electrostatic potential levels of substrate 232 at vertical section line A-A 298 of FIG. 6 when a voltage of approximately 2.5 volts is applied to TX 240 during a charge transfer operation. The depth below surface 244 of substrate 232 (as measured in microns) is illustrated long the x-axis, as indicated at 352, and the potential (in volts) is illustrated along the y-axis, as indicated at 354. Curve 350 illustrates a more gradual "roll-off" of the voltage potential below TX 240 as compared to a similar voltage roll-off below TX 40 of pixel 30 (which is not illustrated), which is indicative of an increase in depth of partially buried channel 249 relative to surface channel 49.

Figure 9:
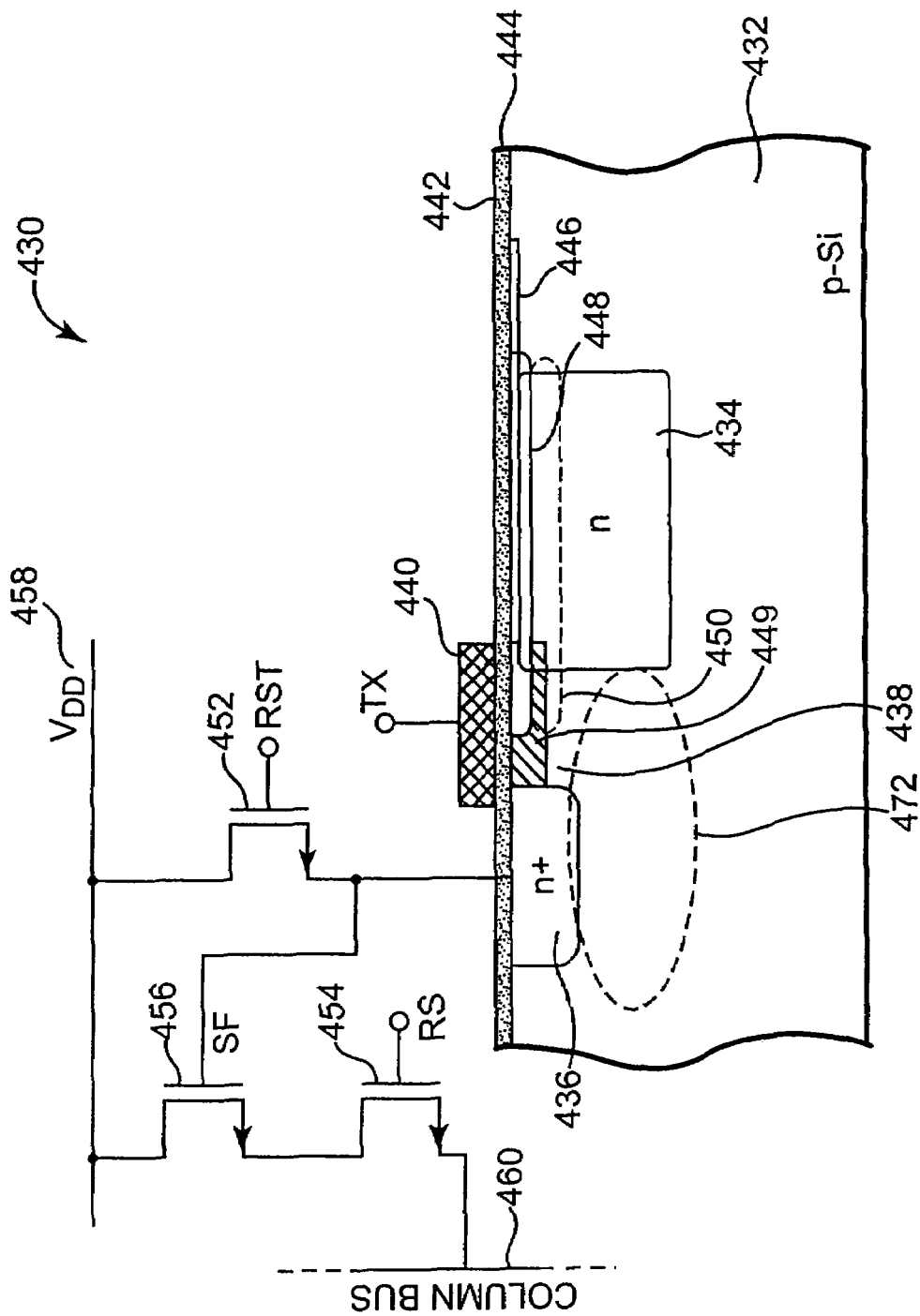
FIG. 9 is a block and schematic diagram illustrating one embodiment of a pixel having an asymmetrically doped, fully-buried channel transfer gate.

FIG. 9 illustrates generally one embodiment of a CMOS pixel 430 employing an asymmetrically-doped fully-buried channel transfer gate in accordance with the present invention. Pixel 430 is similar in configuration to pixel 30 of FIG. 1 and includes a substrate 432 of a first conductivity type and a photodetector 434 formed by an implant of a second conductivity type, which is opposite the first conductivity type, and configured to collect and convert incident light to a charge during an integration period. Photodetector 434 may comprise a photodiode or a pinned photodiode. As illustrated, CMOS pixel 430 is commonly referred to as a 4-transistor, buried-gate photodiode type pixel, wherein photodetector 434 comprises a pinned-photodiode.

A floating diffusion region 436 is formed in substrate 432 of an implant having the second conductivity type. A transfer region 438 of substrate 432 extends generally between photodiode 434 and floating diffusion region 436. A transfer gate (TX) 440 is formed above transfer region 438 and is positioned at least partially over photodiode 434. An insulating layer 442 is positioned between a surface 444 of substrate 432 and transfer gate 440.

In one embodiment, similar to deep anti-punchthrough implant 72 of pixel 30, pixel 430 further includes a deep anti-punchthrough implant 472 of enhanced conductivity relative to substrate 432, as illustrated by the dashed elliptical outline in FIG. 9. In one embodiment, deep anti-punchthrough implant 472 comprises boron. In one embodiment, deep anti-punchthrough implant 472 is implanted such that the doping extends from approximately a center of TX gate 240 into floating diffusion region 436 such that anti-punchthrough implant 472 is asymmetric across transfer region 438. However, unlike pixel 30 described above, pixel 430 does not employ a medium anti-punchthrough implant, such as medium anti-punchthrough implant 70 with respect to FIG. 1.

Pixel 430 further includes a reset (RST) transistor 452, a row select (RS) transistor 454, and a source-follower (SF) transistor 456. The source of reset transistor 452 is coupled to floating diffusion 436 and the drain is coupled to a voltage source ($V_{DD}$) 458. The gate of SF transistor 456 is coupled to the source of RST transistor 452 and the drain is coupled to $V_{DD}$ 458. The drain of RS 454 is coupled to the source of SF transistor 456 and the gate is coupled to a column bus 460 of an array of image sensors to which pixel 430 is associated.

Similar to channel implant region 48 of pixel 30 as illustrated by FIGS. 1-4 above, pixel 430 includes a channel implant region 448 of enhanced conductivity type relative to substrate 432, with channel implant region 438 being at least partially coincident with and at a depth greater than pinning layer 446. In one embodiment, channel implant region 448 comprises boron. In one embodiment, as illustrated, channel implant region 448 extends generally from beyond a midpoint of TX gate 440 to at least across photodiode 434 such that channel implant region 448 forms a junction with photodiode 434. Channel implant region 448 is formed with a dopant concentration of the first conductivity type such that a dopant concentration of transfer region 438 is greater proximate to photodiode 434 than proximate to floating diffusion 436. In effect, transfer region 438 is asymmetrically doped with a dopant of the same conductivity type as substrate 432 such that the dopant concentration is greater adjacent to photodiode 434 than to floating diffusion region 436.

However, unlike pixel 30 described above, channel implant region 448 of pixel 430 is formed at a shallower depth and with a higher dopant concentration relative to channel implant region 48 of pixel 30. For example, in one embodiment, channel implant region 448 has a peak boron concentration in a range from approximately $1e17/cm^3$ to $7e17/cm^3$ at a depth in a range from approximately 0.03 to 0.06 microns. By comparison, in one embodiment, channel implant region 48 of pixel 30 has a peak boron concentration ranging from approximately $8e16/cm^3$ to $2e17/cm^3$ at a depth ranging from approximately 0.04 to 0.05 microns. It is noted that while channel implant region 448 of pixel 430 is at approximately a same depth as channel implant region 248 of pixel 230, channel implant region 248 has a lower dopant concentration.

In addition to channel implant region 448, and unlike both pixel 30 (described above by FIGS. 1-4) and pixel 230 (described above by FIGS. 5-8), pixel 430 of FIG. 9 includes a counter doping implant region 450, as illustrated by the dashed elliptical region, comprising a dopant of the second conductivity type. In one embodiment, counter doping implant region 450 comprises phosphorous. In one embodiment, as illustrated, counter doping implant region 450 is implanted at a depth immediately below channel implant region 448, and in a fashion similar to that of channel implant region 448, extends generally from beyond a midpoint of TX gate 440 to at least across photodiode 434. In one embodiment, as will be illustrated in greater detail below by FIGS. 10 and 11, counter doping implant region 450 is formed with a dopant of the second conductivity type having a concentration such that a doping level in the area below channel implant region 448 in the region below TX gate 440 is compensated completely to make it n-type.

In one embodiment, counter doping implant region 250 has a peak phosphorous concentration which ranges from approximately $1e17/cm^3$ to $5e17/cm^3$ at a depth in a range from approximately 0.03 to 0.10 microns.

As a result of employing channel implant region 448, which is implanted at a shallower depth and at a higher dopant concentration relative to channel implant region 48 of pixel 30 but at a higher dopant concentration level than channel implant region 248 of pixel 230, by not employing a medium anti-punchthrough implant similar to medium anti-punchthrough implant 70 (as illustrated by FIG. 1), and by employing counter doping region 450, pixel 430 of FIG. 9 forms a fully-buried channel 449 (as illustrated by the hatched area) when a voltage is applied to TX gate 440 during a charge transfer operation. In one embodiment, fully-buried channel 449 extends to a depth below surface 444 of substrate 432 that ranges from approximately 0.04 to 0.05 microns. In one embodiment, as illustrated, fully-buried channel region 449 does not form in the region of channel implant region 448 below TX gate 440. By comparison, in one embodiment, surface channel 49 of pixel 30 extends to a depth below surface 44 of substrate 32 that ranges from approximately 0.01 to 0.02 microns, and partially-buried channel 249 of pixel 230 extends to a depth below surface 244 of substrate 232 that ranges from approximately 0.02 microns to 0.03 microns.

By forming fully-buried channel 449 at a depth below surface 444 of substrate 432 which is greater than the depth of surface channel 49 of pixel 30 (and greater than the depth of partially-buried channel 249 of pixel 230), the efficiency of charge transfer from photodiode 434 to floating diffusion region 436 is enhanced relative to pixel 30. As a result, pixel 430 of FIG. 9 can employ a photodiode 434 that is implanted to a greater depth than photodiode 34 of pixel 30. In one embodiment, photodiode 434 extends below surface 444 of substrate 432 to a depth that ranges from approximately 0.30 to 0.45 microns. In other embodiments, photodetector 434 may extend to depths greater than 0.45 microns. By comparison, in one embodiment, photodiode 34 of pixel 30 extends to a depth that ranges from approximately 0.30 to 0.35 microns below surface 44. In other embodiments, photodetector 34 of pixel 30 may extend to depths greater than 0.35 microns, but for reasons described above, is generally at a shallower depth relative to photodetector 434 of pixel 430.

Also, due to its deeper depth, photodiode 434 of pixel 430 is able to employ a lower dopant concentration than photodiode 34 of pixel 30. For example, in one embodiment, photodiode 434 comprises a peak phosphorous concentration in a range from approximately $2e16/cm^3$ to $3e16/cm^3$. By comparison, in one embodiment, photodiode 34 of pixel 30 comprises a peak phosphorous concentration in a range from approximately $3e17/cm^3$ to $4e17/cm^3$.

By utilizing fully-buried channel 449, which in-turn enables photodiode 434 to be deeper and have a lower dopant concentration, photodiode 434 has an improved full-well capacity relative to photodiode 34 of pixel 30, and pixel 430 has an improved hot pixel performance relative to pixel 30. In addition, in a fashion similar to that described above with respect to channel implant region 48 of pixel 30, the asymmetric doping of transfer region 438 resulting from channel implant 448 substantially reduces the occurrence of charge slosh-back, thereby further improving image quality. In one embodiment, as illustrated, substrate 432 is of p-type conductivity (e.g. p-type silicon) and photodiode 434 and floating diffusion 436 are of n-type conductivity (e.g. phosphorous, arsenic). In one embodiment, as illustrated, the dopant of photodiode 434 and floating diffusion region 436 comprise phosphorous. In one embodiment, pinning layer 446 and channel implant region 448 include additional dopant of the same type as substrate 432, p-type as illustrated. In one embodiment, the dopant of substrate 432, pinning layer 446, and channel implant region 448 comprises a material of p-type conductivity such as boron, aluminum, gallium, and indium. In one embodiment, as illustrated, the dopant of substrate 432, pinning layer 446, and channel implant region 448 comprises boron. In one embodiment, the dopant of photodiode 434 and floating diffusion 436 comprise phosphorous.

Figure 10:
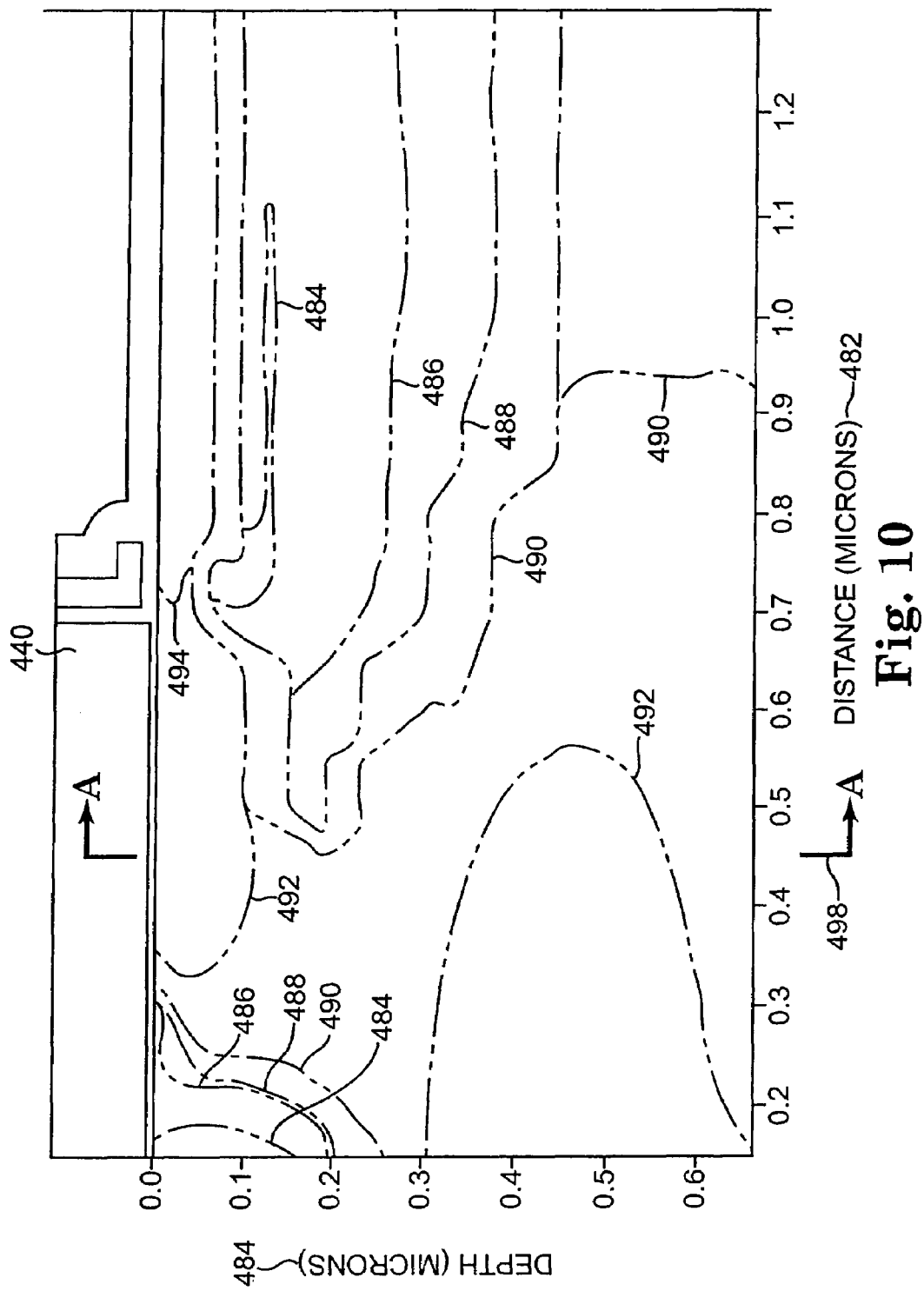
FIG. 10 is a cross-sectional view of the pixel of FIG. 9 illustrating example dopant concentration contours.

FIG. 10 is a cross-sectional view of a portion of pixel 430 of FIG. 9 illustrating one example of contours of net dopant levels in substrate 432 of pixel 430. The distance across pixel 430 (as measured in microns) is indicated along axis 480, and the depth below surface 444 of substrate 432 (as measured in microns) is illustrated long the y-axis, as indicated at 482. Boron contour lines 484-494 are illustrated as dashed lines.

Figure 11:
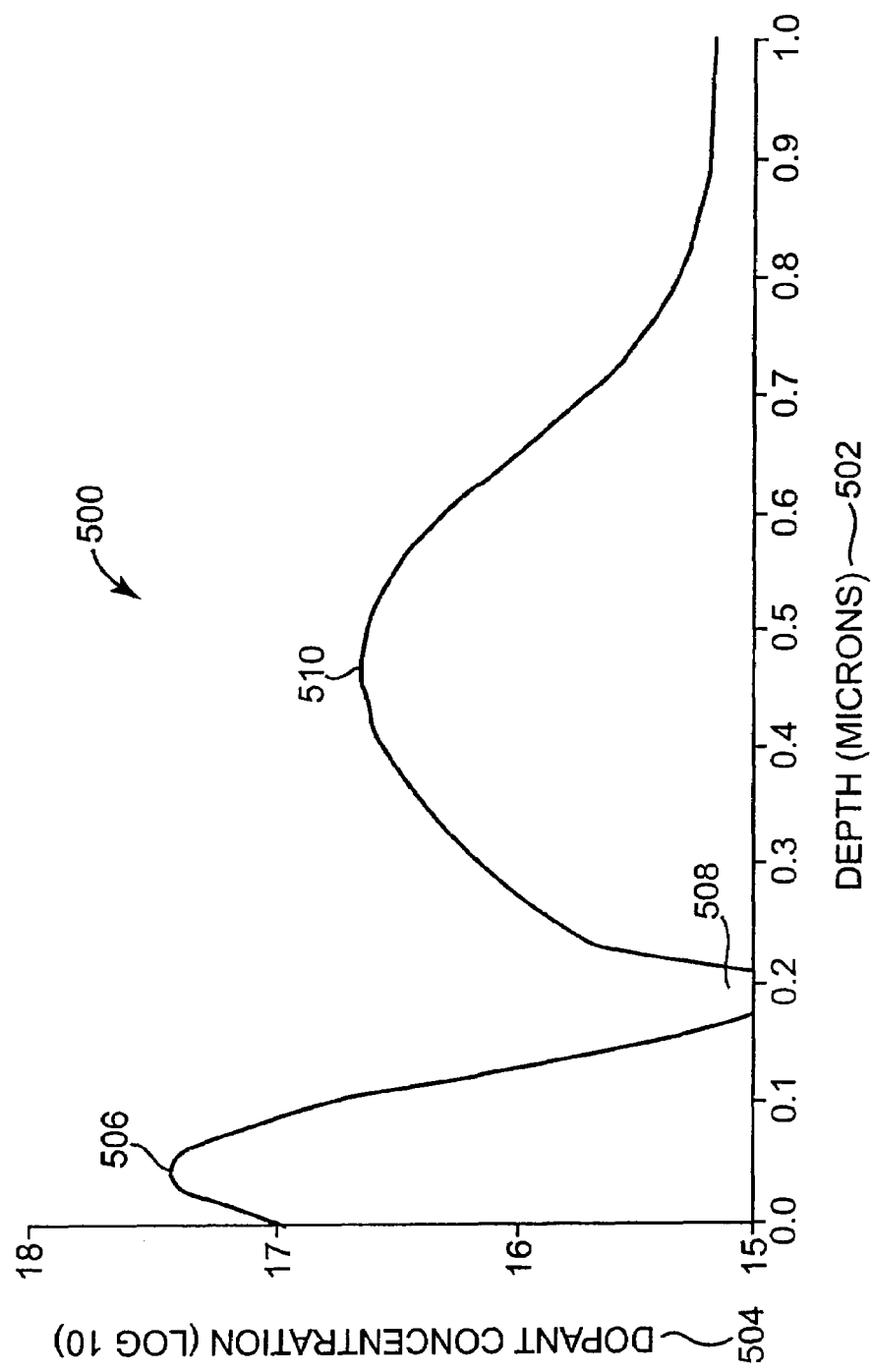
FIG. 11 is a graph illustrating dopant concentration levels at a section through the pixel of FIG. 10.

Implant concentrations are typically measured in terms of the number of implanted dopant atoms per cubic centimeter of substrate. In FIG. 11, the dopant contours represent the net dopant levels in terms of the n-type concentration level minus the p-type concentration levels. In one embodiment, as illustrated, contour line 484 represents a net dopant concentration of approximately $2.5e17/cm^3$, contour line 486 represents a net dopant concentration of approximately $1.3e16/cm^3$, contour line 488 represents a net dopant concentration of approximately $6.3e14/cm^3$, contour line 490 represents a net dopant concentration of approximately $-1.6e15/cm^3$, and contour line 492 represents a net dopant concentration of approximately $-4.0e17/cm^3$.

From FIG. 10, it can be seen that the dopant concentrations of channel implant region 448 are net negative and are indicative of transfer region 438 having a higher boron concentration adjacent to photodiode 434 than to floating diffusion region 436. Similarly, dopant concentrations are net negative in the region of deep anti-punchthrough layer 472 and indicative of a higher boron concentration adjacent to floating diffusion region 436 than to photodiode 434. Additionally, dopant concentration levels in the region of counter doping implant region 450 indicate levels approximately at or below dopant concentrations of epi substrate 432.

FIG. 11 is a curve 500 illustrating net dopant concentration levels of substrate 432 at a vertical section line A-A through pixel 430, as indicated at 498 in FIG. 11. Section A-A 498 corresponds approximately to a midpoint of TX gate 440. The depth below surface 444 of substrate 432 (as measured in microns) is illustrated long the x-axis, as indicated at 502, and net dopant concentration (in log 10) is illustrated along the y-axis, as indicated at 504.

A first peak 506 at a depth of approximately 0.03 microns and a boron concentration of approximately $1.6e17/cm^3$ represents the peak boron concentration of channel implant region 248 at approximately the midpoint of TX gate 240. A valley 508 at a depth approximately 0.18 microns represents the dopant concentration in the region of counter doping implant region 450 between photodiode 234 and floating diffusion 236 which fully compensates for doping of epi substrate 232 and also is indicative of the exclusion of the medium anti-punchthrough implant (e.g. medium anti-punchthrough implant 70 of pixel 30 in FIGS. 1 and 4)) from pixel 430. A second peak 510 at a depth of approximately 0.45 microns and a boron concentration of approximately $2e16/cm^3$ represents the boron implant of deep anti-punchthrough implant 272.

Figure 12:
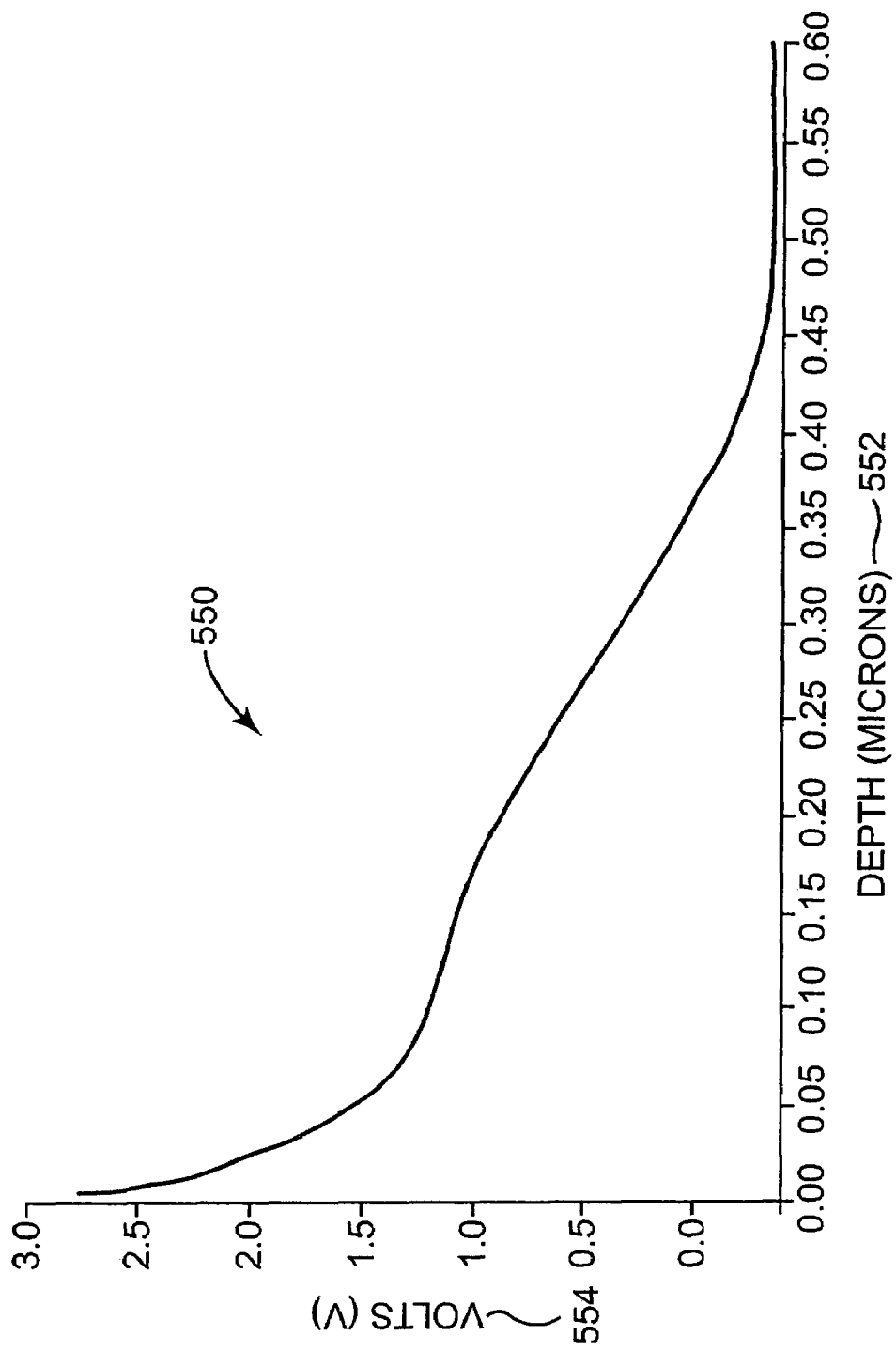
FIG. 12 is a graph illustrating potential levels at a section through the pixel of FIG. 10.

FIG. 12 is a curve 550 illustrating electrostatic potential levels of substrate 432 at vertical section line A-A 498 of FIG. 10 when a voltage of approximately 2.5 volts is applied to TX 240 during a charge transfer operation. The depth below surface 444 of substrate 432 (as measured in microns) is illustrated long the x-axis, as indicated at 552, and the potential (in volts) is illustrated along the y-axis, as indicated at 554. Curve 550 illustrates a more gradual "roll-off" of the voltage potential from surface 444 below TX 440 as compared to the voltage roll-off below TX 240 of pixel 230 (as illustrated by FIG. 8) and is indicative of an increase in the depth of fully-buried channel 449 relative to partially buried channel 249 (as well as to surface channel 49 of pixel 30 for which a potential distribution is not illustrated herein).

It is noted that specific levels and/or ranges of levels of dopant concentrations and specific implant depths and/or ranges of implant depths described herein for channel implant regions 48, 248, and 448, counter doping region 450, and photodetectors 34, 234, and 434 are intended as illustrative examples and may vary depending on particular pixel configurations.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A pixel, comprising:
    a substrate of a first conductivity type and having a surface;
    a photodetector of a second conductivity type that is opposite the first conductivity type;
    a floating diffusion region of the second conductivity type;
    a transfer region between the photodetector and the floating diffusion;
    a gate positioned above the transfer region and partially overlapping the photodetector;
    a pinning layer of the first conductivity type extending at least across the photodetector from the gate;
    a channel implant of the first conductivity type; and
    a counter doping implant of the second conductivity type positioned below the channel implant, the channel implant and the counter doping implant each extending from between a midpoint of the transfer gate and the floating diffusion to at least across the photodetector, wherein the channel implant has a dopant concentration such that a dopant concentration of the transfer region is greater proximate to the photodetector than the floating diffusion, and wherein the counter doping implant has a dopant concentration which at least compensates for a doping of the substrate in an area of the transfer region below the channel implant such that a fully-buried channel is formed in the transfer region between the photodetector and floating diffusion when the transfer gate is energized.

2. The pixel of claim 1, wherein a peak dopant concentration of the channel implant ranges from approximately 1e17/cm3 to 7e17/cm3.

3. The pixel of claim 2, wherein the channel implant comprises boron.

4. The pixel of claim 1, wherein the channel implant has a peak dopant concentration at a depth which ranges from approximately 0.03 microns to 0.06 microns.

5. The pixel of claim 1, wherein the counter doping implant has a peak dopant concentration which ranges from approximately $1e17/cm^3$ to $5e17$ $cm^3$.

6. The pixel of claim 5, wherein the counter doping implant comprises phosphorous.

7. The pixel of claim 1, wherein the counter doping implant has a peak dopant concentration at a depth which ranges from approximately 0.03 microns to approximately 0.1 microns.

8. The pixel of claim 1, wherein the photodetector extends to a depth of at least 0.3 microns below the surface.

9. The pixel of claim 1, further comprising a deep anti-punchthrough implant of the first conductivity type and having a concentration such that a region of the substrate proximate to floating diffusion has a higher dopant concentration than a region of the substrate proximate to the photodetector.

10. A method of operating a pixel having a substrate of a first conductivity type, a photodetector of a second conductivity type which is opposite the first conductivity type, a floating diffusion of the second conductivity type, and a transfer gate position above a transfer region between the photodetector and the floating diffusion, the method comprising:

accumulating a charge in the photodetector during an integration period;

forming a channel in the transfer region through which to transfer the charge from the photodetector to the floating diffusion to by applying a voltage to the transfer gate during a charge transfer operation; and forming an asymmetric electrostatic potential across the channel such that charge in the channel is directed to the floating diffusion and blocked from the photodetector when the voltage is removed from the transfer gate at the completion of the charge transfer operation.

11. The method of claim 10, wherein forming the asymmetric electrostatic potential includes providing a channel implant of the first conductivity type from approximately between a midpoint of the transfer gate and the floating diffusion to at least across the photodetector and having a dopant concentration such that a dopant concentration of the transfer region is greater proximate to the photodetector than the floating diffusion.

12. The method of claim 10, wherein forming the channel includes forming a surface channel.

13. The method of claim 10, wherein forming the channel includes forming a partially-buried channel.

14. The method of claim 10, wherein forming the channel includes forming a fully-buried channel.

* * * * *